(12) United States Patent
Petit

(10) Patent No.: US 11,143,858 B2
(45) Date of Patent: Oct. 12, 2021

(54) MEMS SCANNING MODULE FOR A LIGHT SCANNER

(71) Applicant: Blickfeld GmbH, Munich (DE)

(72) Inventor: Florian Petit, Munich (DE)

(73) Assignee: Blickfeld GmbH, Munich (DE)

( * ) Notice: Subject to any disclaimer, the term of this patent is extended or adjusted under 35 U.S.C. 154(b) by 224 days.

(21) Appl. No.: 16/463,647

(22) PCT Filed: Nov. 22, 2017

(86) PCT No.: PCT/DE2017/101007
§ 371 (c)(1),
(2) Date: May 23, 2019

(87) PCT Pub. No.: WO2018/095486
PCT Pub. Date: May 31, 2018

(65) Prior Publication Data
US 2020/0183150 A1  Jun. 11, 2020

(30) Foreign Application Priority Data

Nov. 23, 2016 (DE) ............... 10 2016 014 001.1

(51) Int. Cl.
*G02B 26/08* (2006.01)
*B81B 3/00* (2006.01)
*G01S 7/481* (2006.01)
*G01S 17/00* (2020.01)

(52) U.S. Cl.
CPC ........ *G02B 26/0858* (2013.01); *B81B 3/0021* (2013.01); *G01S 7/4817* (2013.01); *B81B 2201/04* (2013.01); *G01S 17/003* (2013.01)

(58) Field of Classification Search
None
See application file for complete search history.

(56) References Cited

U.S. PATENT DOCUMENTS

| 4,878,721 A | 11/1989 | Paulsen |
| 5,280,165 A * | 1/1994 | Dvorkis ............. G06K 7/10564 |
| | | 235/470 |
| 5,742,377 A * | 4/1998 | Minne ................. G03F 7/70358 |
| | | 355/71 |
| 5,915,063 A | 6/1999 | Colbourne |
| 5,926,307 A | 7/1999 | Tanaka |

(Continued)

FOREIGN PATENT DOCUMENTS

| JP | 2009192967 A | 8/2009 |
| JP | 2011039217 A | 2/2011 |

OTHER PUBLICATIONS

International Search Report dated May 7, 2018 in connection with International Application No. PCT/DE2017/101007.

*Primary Examiner* — Jennifer D. Carruth
(74) *Attorney, Agent, or Firm* — Eschweiler & Potashnik, LLC

(57) ABSTRACT

A scanning module (100) for a light scanner (99) comprises a base (141) and an interface element (142) which is configured to secure a mirror surface (151). The scanning module (100) also comprises at least one support element (101, 102) which extends between the base (141) and the interface element (142) and has an extension perpendicular to the mirror surface (151) which is no less than 0.7 mm. The base (141), the interface element (142) and the at least one support element (101) are integrally formed.

11 Claims, 22 Drawing Sheets

(56) References Cited

U.S. PATENT DOCUMENTS

| | | | |
|---|---|---|---|
| 6,115,167 A | 9/2000 | Genequand | |
| 6,498,870 B1* | 12/2002 | Wu | B82Y 30/00 |
| | | | 385/16 |
| 6,647,164 B1* | 11/2003 | Weaver | G02B 26/0866 |
| | | | 359/224.1 |
| 6,956,683 B2* | 10/2005 | Heaton | G02B 7/1821 |
| | | | 359/200.6 |
| 7,009,755 B2* | 3/2006 | Fu | G02B 26/0841 |
| | | | 359/223.1 |
| 7,133,185 B2* | 11/2006 | Wen | G02B 6/3572 |
| | | | 359/298 |
| 7,639,413 B2 | 12/2009 | Nishikawa | |
| 8,472,096 B2* | 6/2013 | Fujii | G02B 26/0833 |
| | | | 359/199.1 |
| 8,853,804 B2* | 10/2014 | Krylov | B81B 3/0021 |
| | | | 257/415 |
| 9,721,858 B2* | 8/2017 | Fornara | H01L 23/04 |
| 9,869,858 B2* | 1/2018 | Gerson | G01S 17/42 |
| 10,401,865 B1* | 9/2019 | Ulrich | G05D 1/0231 |
| 2001/0036000 A1 | 11/2001 | Nishikawa | |
| 2002/0149363 A1 | 10/2002 | Ikegame | |
| 2002/0195674 A1* | 12/2002 | Weaver | B81B 3/0024 |
| | | | 257/415 |
| 2003/0032215 A1* | 2/2003 | Ives | G01P 15/08 |
| | | | 438/52 |
| 2004/0246555 A1* | 12/2004 | Kohl | F03G 7/065 |
| | | | 359/224.1 |
| 2004/0252356 A1* | 12/2004 | Heaton | G02B 7/1821 |
| | | | 359/200.6 |
| 2006/0198006 A1* | 9/2006 | Kato | G02B 26/101 |
| | | | 359/224.1 |
| 2006/0250675 A1* | 11/2006 | Willemsen | G02B 26/085 |
| | | | 359/224.1 |
| 2007/0109560 A1* | 5/2007 | Sprague | G02B 26/0858 |
| | | | 358/1.1 |
| 2007/0115072 A1* | 5/2007 | Kato | G02B 26/085 |
| | | | 331/176 |
| 2010/0090565 A1* | 4/2010 | Bhaskaran | B81B 3/0021 |
| | | | 310/330 |
| 2012/0008185 A1* | 1/2012 | Park | G02B 26/0841 |
| | | | 359/213.1 |
| 2012/0127558 A1* | 5/2012 | Haspeslagh | G02B 26/06 |
| | | | 359/291 |
| 2013/0147004 A1* | 6/2013 | Rivero | G01K 5/62 |
| | | | 257/467 |
| 2016/0178895 A1* | 6/2016 | Gerson | G01S 17/10 |
| | | | 359/199.4 |
| 2018/0059408 A1* | 3/2018 | Murayama | G01S 7/4817 |
| 2019/0271766 A1* | 9/2019 | Petit | G01S 7/4818 |
| 2019/0310465 A1* | 10/2019 | Petit | H02N 2/062 |
| 2019/0361223 A1* | 11/2019 | Albert | G02B 26/0841 |
| 2020/0057298 A1* | 2/2020 | Boni | G02B 26/101 |
| 2020/0081243 A1 | 3/2020 | Ito | |
| 2020/0110260 A1* | 4/2020 | Petit | G01S 17/89 |
| 2020/0218063 A1* | 7/2020 | Petit | G02B 26/105 |

* cited by examiner

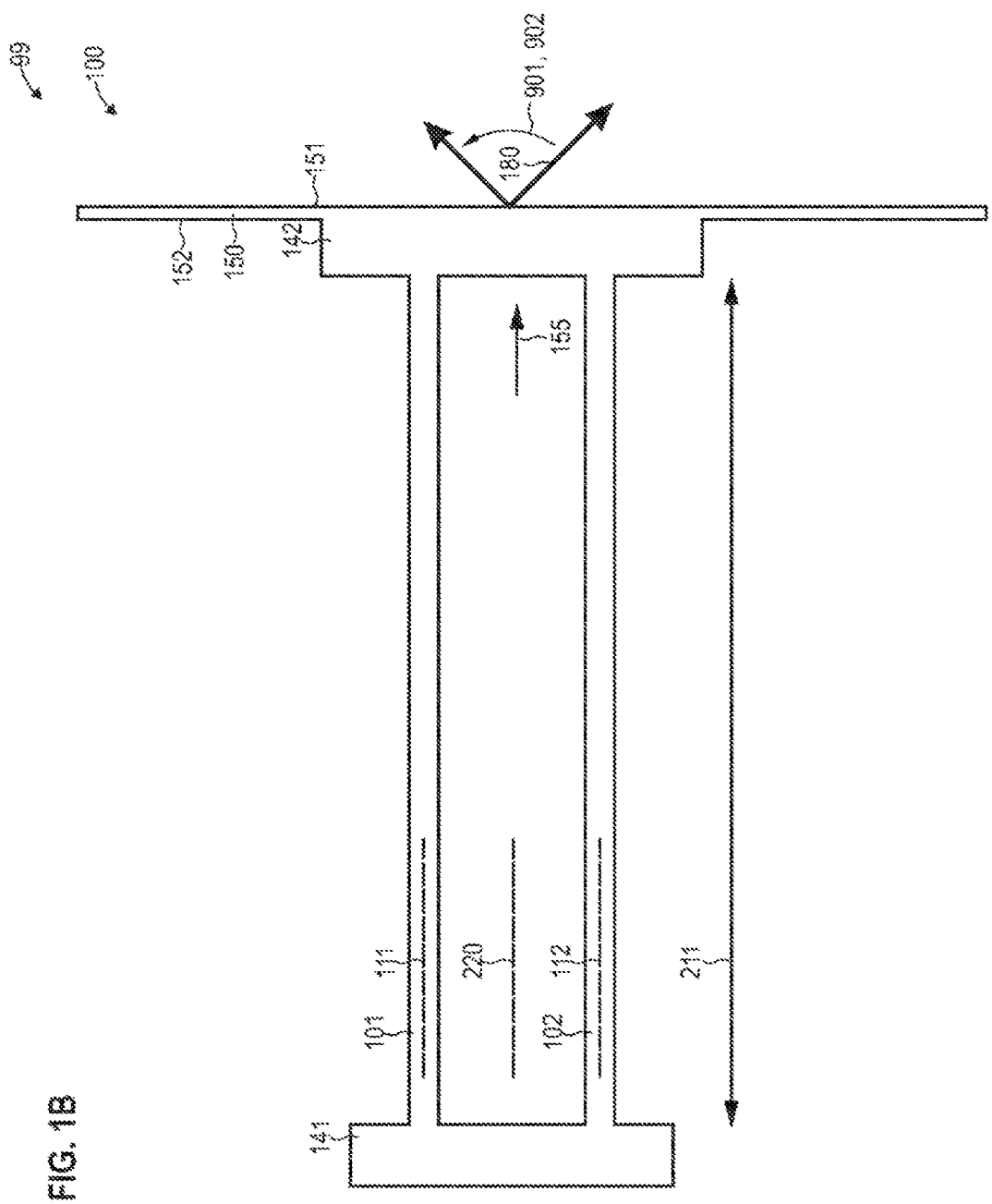

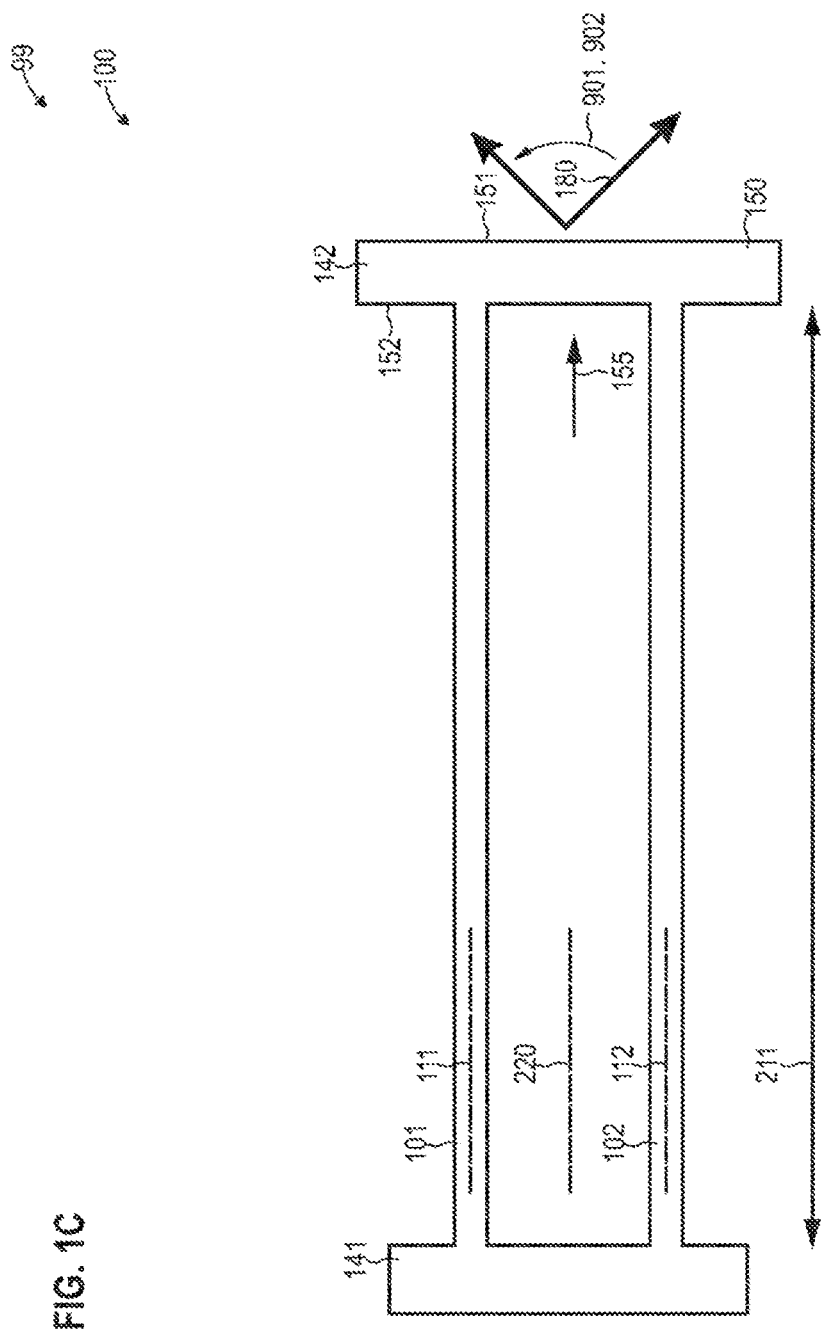

MEMS SCANNING MODULE FOR A LIGHT SCANNER

REFERENCE TO RELATED APPLICATIONS

This application is a National Phase entry application of International Patent Application No. PCT/DE2017/101007 filed Nov. 22, 2017, which claims priority to German Application 10 2016 014 001.1 filed Nov. 23, 2016, the contents of which are hereby incorporated by reference in their entirety.

TECHNICAL FIELD

The invention relates in general to a scanning module for a light scanner. In particular, the invention relates to a scanning module with at least one resilient support element which extends between a base and an interface element for securing a mirror surface and has an extension perpendicular to the mirror surface which is no less than 0.7 mm. This enables resonant scanning.

BACKGROUND

The distance measurement of objects is desirable in various technology fields. For example, in the context of autonomous driving applications, it can be desirable to detect objects in the surroundings of vehicles and, in particular, to determine a distance to the objects.

One technique for distance measurement of objects is the so-called LIDAR technology (light detection and ranging; sometimes also LADAR). Here, pulsed laser light is emitted by an emitter. The objects in the surroundings reflect the laser light. These reflections can subsequently be measured. By determining the propagation time of the laser light, a distance to the objects can be determined.

For the spatially resolved detection of the objects in the surroundings, it is possible to scan the laser light. Depending on the radiation angle of the laser light, different objects in the surroundings can thereby be detected.

Microelectromechanical (MEMS) components can be used for this purpose, in order to implement a laser scanner. See, for example, DE 10 2013 223 937 A1. Here, typically, a mirror is connected via lateral spring elements to a substrate. The mirror and the spring elements are integrally formed or integrated with the substrate. The mirror is released by appropriate etching processes from a wafer.

However, such techniques have certain disadvantages and limitations. For example, the scanning angle is often relatively limited, for example, on the order of magnitude of 20°-60°. In addition, the usable mirror area is often limited; typical mirrors can have a side length of 1 mm-3 mm. Therefore, in LIDAR techniques, the detector aperture can be limited; this has the result that only relatively close objects can be reliably measured.

In order to remedy these disadvantages, it is known to operate multiple mirrors in a synchronized manner. See, for example, Sandner, Thilo, et al. "Large aperture MEMS scanner module for 3D distance measurement." MOEMS-MEMS. International Society for Optics and Photonics, 2010. However, the synchronization can be relatively elaborate. In addition, it can then be impossible or only limitedly possible to implement two-dimensional scanning. Here too, the scanning angle is limited.

BRIEF SUMMARY OF THE INVENTION

Therefore, there is a need for improved techniques for measuring distances of objects in the surroundings of a device. In particular, there is a need for such techniques which remedy at least some of the above-mentioned limitations and disadvantages.

This aim is achieved by the features of the independent claim. The dependent claims define embodiments.

In an example, a scanning module for a light scanner comprises a base and an interface element. The interface element is configured to secure a mirror surface. The scanning module also comprises at least one resilient support element which extends between the base and the interface element and which has an extension perpendicular to the mirror surface which is no less than 0.7 mm. The base, the interface element and the at least one support element are integrally formed.

Since the at least one support element is designed to be resilient, it can also be referred to as a spring element. Thereby, at least one degree of freedom of motion of the at least one support element can be excited in a resonant manner. This corresponds to the resonant operation of the light scanner (resonant scanner). This is to distinguish it from non-resonant light scanners, for example, with ball bearings for a constant rotating motion or step motors.

For example, it would be possible that at least one support element has an extension perpendicular to the base which is no less than 1 mm, optionally no less than 3.5 mm, moreover optionally no less than 7 mm.

Since the at least one support element has a significant extension perpendicularly to the mirror surface, this element—in contrast to the lateral spring elements in the prior art—can also be referred to as a perpendicularly oriented support element. By means of such an arrangement, particularly large scanning angles can be generated, for example, in the range of 120°-180°.

In some examples, it would be possible for the scanning module to have at least two support elements. The scanning module could comprise at least three support elements, optionally at least four support elements. Thereby, particularly robust scanning modules having a low susceptibility to vibrations can be produced.

For example, it would be possible that the longitudinal axes of the at least two support elements pairwise in each case enclose angles which are no greater than 45°, optionally no greater than 10°, moreover optionally no greater than 1°. This means that the at least two support elements can be arranged parallel or substantially parallel to one another.

The at least two support elements could have an arrangement with rotational symmetry with respect to a central axis. Here, it would be possible for the rotation symmetry to be n-fold, wherein n refers to the number of the at least two support elements. Thereby, it is possible to avoid non-linear effects during resonant operation of the light scanner.

For the resonant operation of the light scanner, at least one degree of freedom of motion of the at least one support element can be excited.

The at least one degree of freedom of motion could comprise a transverse mode and a torsion mode, wherein the natural frequency of the lowest transverse mode is greater than the natural frequency of the lowest torsion mode.

The at least one degree of freedom of motion could comprise a transverse mode and a torsion mode, wherein the lowest transverse mode is degenerated with the lowest torsion mode. Thereby, it can be achieved that the scanning module is particularly robust with respect to external excitations.

The torsion mode can correspond to a twisting of the two support elements. The torsion mode can denote a twisting of each individual support element along the corresponding longitudinal axis. Optionally, the torsion mode can also denote a twisting of multiple support elements into one another.

It would be also possible that the distance between two adjacent support elements of the at least two support elements is in the range of 2%-50% of the length of at least one of the at least two support elements, optionally in the range of 10%-40%, moreover optionally in the range of 12-20%. This can enable a compact design and an adapted frequency of the torsion mode.

It would be possible that the at least two support elements have lengths which differ from one another by no more than 10%, optionally no more than 2%, moreover optionally no more than 0.1%.

For example, it would be possible for the scanning module to have a balancing weight. The balancing weight can be attached to at least one of the at least one interface element. The balancing weight can in particular be integrally formed with the at least one interface element. For example, it would be possible for the balancing weight to be implemented by a change of the cross-sectional area along the longitudinal axis of the at least one interface element. By means of the balancing weight, the moment of inertia can be changed. Thereby, the frequency of the torsion mode of the at least one interface element can be adapted to the frequency of the transverse modes of the at least one interface element. Depending on the design of the balancing weight, it would be possible, for example, that a degeneration of the natural frequencies of the orthogonal transverse modes of the at least one interface element is eliminated.

In an example, the scanning module comprises a first piezo bending actuator, a second piezo bending actuator, and the base which is arranged between the first piezo bending actuator and the second piezo bending actuator. The piezo bending actuators could thus excite at least one support element via the base in a coupled manner.

Here, the first piezo bending actuator could have an elongate form along a first longitudinal axis, and the second piezo bending actuator could have an elongate form along a second longitudinal axis. The first longitudinal axis and the second longitudinal axis could enclose an angle with one another which is less than 20°, optionally smaller than 10°, moreover optionally smaller than 1°.

The first longitudinal axis and/or the second longitudinal axis could enclose an angle with a longitudinal axis of the at least one support element, which is less than 20°, optionally less than 10°, moreover optionally less than 1°. Alternatively, it would also be possible that the first longitudinal axis and/or the second longitudinal axis enclose an angle with a longitudinal axis of the at least one support element, which is in the range of 90°±20°, optionally in the range of 90°±10°, moreover optionally in the range of 90°±1°. The base could have a longitudinal extension along a first longitudinal axis of the first bending piezo actuator, which is in the range of 2-20% of the length of the first piezo bending actuator along the first longitudinal axis, optionally in the range of 5-15%. In this manner, particularly large scanning angles can be achieved, and an efficient excitation of different degrees of freedom of motion of the at least one support element can be achieved.

The base could have a longitudinal extension along a second longitudinal axis of the second bending piezo actuator, which is in the range of 2-20% of the length of the second piezo bending actuator along the second longitudinal axis, optionally in the range of 5-15%. Thereby, it can be achieved that the bending piezo actuator can apply a sufficiently strong force onto the base for the efficient excitation of different degrees of freedom of motion of the at least one support element.

The first piezo bending actuator could have an elongate form along a first longitudinal axis. The second piezo bending actuator could also have an elongate form along a second longitudinal axis. The first piezo bending actuator could extend along the first longitudinal axis, and the second piezo bending actuator could extend along the second longitudinal axis along a longitudinal axis of the at least one support element to a freely mobile end of the at least one support element.

The device could also comprise a driver which is configured to control the first bending piezo actuator with a first signal form and to control the second bending piezo actuator with a second signal form. Here, the first signal form and the second signal form could have out-of-phase signal contributions.

Optionally, it would also be possible for the second signal form to have additional in-phase signal contributions which are optionally amplitude modulated. For example, the amplitude of the in-phase signal contributions for the time duration required for the scanning of the scanning area (correlates with the refresh rate), could increase or decrease monotonically. A linear time dependence of the envelope curve would be possible.

Here, the signal contributions could have a first frequency, wherein the additional signal contributions have a second frequency, wherein the first frequency is in the range of 95-105% of the second frequency or in the range of 45-55% of the second frequency.

It would be possible for the first signal form and/or the second signal form to have a DC portion.

A method comprises defining an etching mask by means of lithography on a wafer. The method also comprises etching the wafer by means of the etching mask for obtaining at least one etched structure which forms a scanning module. The method moreover comprises securing a mirror with mirror surface on an interface element of the scanning module.

The method can be used for producing a scanning module according to various examples described herein. Since the scanning module is produced from a wafer—for example, a silicon wafer or a silicon on insulator wafer (SOI wafer), such techniques can also be referred to as MEMS techniques.

The securing of the mirror on the interface element can comprise at least one of the following techniques: gluing, anodic bonding, direct bonding, eutectic bonding, thermocompression bonding, adhesive bonding.

For example, as adhesive, an epoxy resin or a polymethyl methacrylate (PMMA) could be used.

The method could moreover comprise connecting several etched structures which form the scanning module before securing the mirror. Corresponding techniques can be used for connecting the etched structures which were described above in the context of securing the mirror, i.e., gluing, anodic bonding, direct bonding, eutectic bonding, thermocompression bonding, adhesive bonding.

In general, a large number of structures can be defined for each wafer, so that a large number of scanning modules can be obtained for each wafer. Parallel wafer-level processing can thus avoid individual handling of individual scanning modules. At a certain stage in the processing, the release of individual structures can occur, for example, by cutting or sawing the wafer. Scanning module-level processing can then occur. In general, it would be possible for the connection of the multiple etched structures forming the scanning module to occur at the wafer level—i.e., before releasing individual scanning modules. However, it would also be possible for the connection of the multiple etched structures to occur at the scanning module level—i.e., after releasing individual scanning modules.

Each of the multiple etched structures can comprise a base, an interface element, and at least one support element which extends between the respective base and the respective interface element. Then, the connection of the multiple etched structures to the bases and to the interface elements of the multiple etched structures can occur.

The connection can occur directly or via spacers.

A scanning module for a resonant light scanner comprises a mirror. The mirror has a mirror surface. The mirror also has a back side. The back side is located opposite the mirror surface. The scanning module also has at least one resilient support element which extends away from the back side. The at least one resilient support element is produced by MEMS techniques.

This can mean that the at least one resilient support element is manufactured by wafer etching and lithography from a silicon or SOI wafer. This can mean, for example, that the at least one resilient support element is formed from a monocrystalline material and can thus withstand particularly strong tensions.

The features explained above and features described below can be used not only in the corresponding explicitly represented combinations but also in other combinations or alone, without leaving the scope of protection of the present invention.

BRIEF DESCRIPTION OF THE FIGURES

FIG. 1B diagrammatically illustrates a scanning module for a light scanner according to various examples, wherein the scanning module in the example of FIG. 1B has two support elements arranged parallel to one another, and a mirror which is integrally formed.

FIG. 1C diagrammatically illustrates a scanning module for a light scanner according to various examples, wherein the scanning module in the example of FIG. 1C has two support elements arranged parallel to one another, and a mirror surface which is applied on an interface element of the scanning module.

FIG. 14 illustrates a spectrum of the excitation of at least one support element, wherein FIG. 14 represents a degeneration between a torsion mode and a transverse mode according to various examples.

FIG. 15 illustrates a spectrum of the excitation of at least one support element, wherein FIG. 15 represents in an eliminated degeneration between a torsion mode and a transverse mode according to various examples.

DETAILED DESCRIPTION OF EMBODIMENTS

Figure 1A:
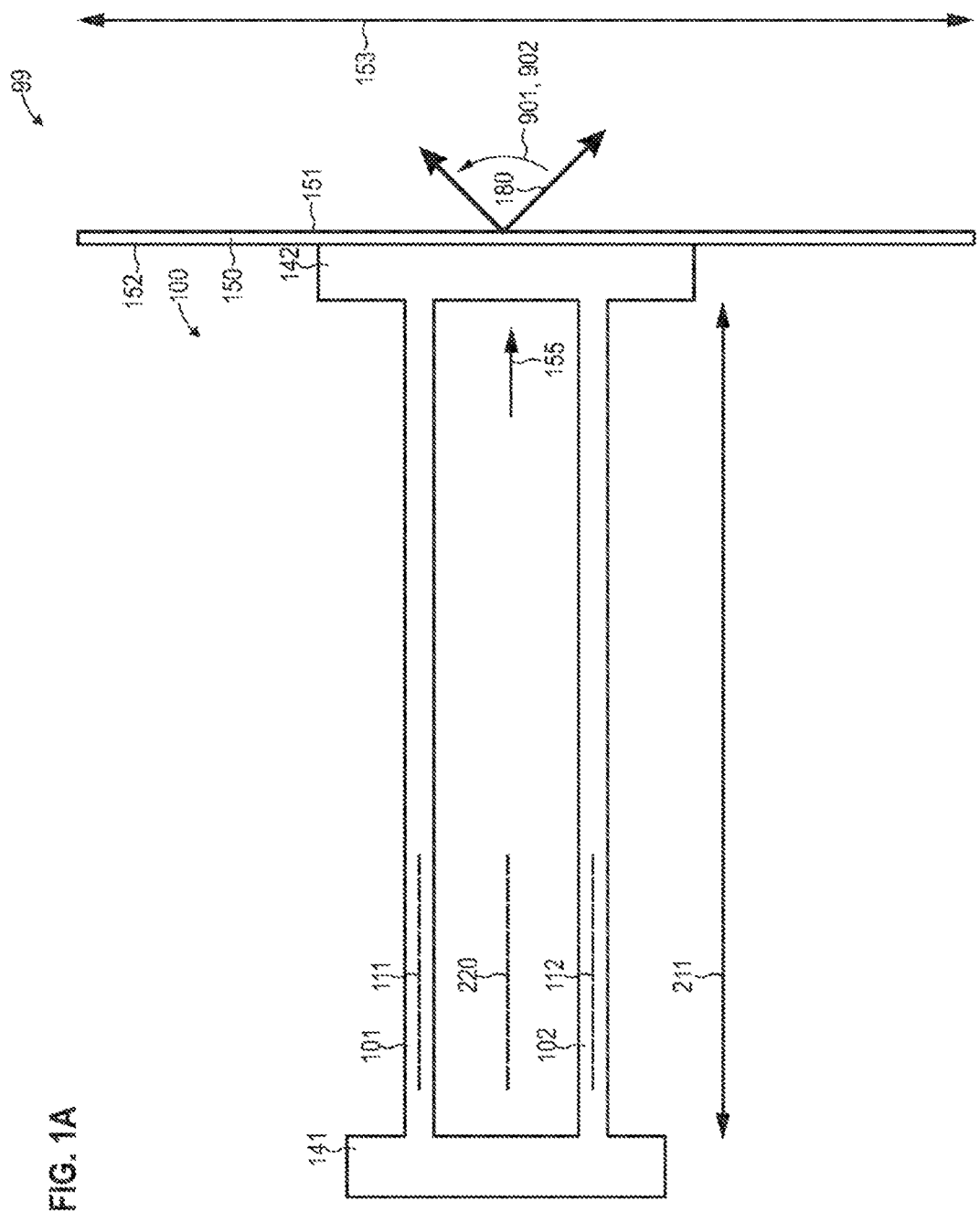
FIG. 1A diagrammatically illustrates a scanning module for a light scanner according to various examples, wherein the scanning module in the example of FIG. 1A has two support elements arranged parallel to one another, and a mirror which is not integrally formed.

The above-described characteristics, features and advantages of this invention and the manner in which they are achieved are clarified and can be better understood based on the following description of the embodiment examples which are explained in further detail in reference to the drawings.

Below, the present invention is explained in further detail based on preferred embodiments in reference to the drawings. In the figures, identical reference numerals denote identical or similar elements. The figures are diagrammatic representations of different embodiments of the invention. Elements represented in the figures are not necessarily represented true to scale. Instead, the different elements represented in the figures are reproduced in such a manner that their function and general purpose are understandable to the person skilled in the art. Connections and couplings between functional units and elements represented in the figures can also be implemented as indirect connection or coupling. Functional units can be implemented as hardware, software or as a combination of hardware and software.

Below, various techniques for scanning light are described. The techniques described below can enable, for example, the two-dimensional scanning of light. The scanning can denote repeated emission of the light at different radiation angles. For this purpose, the light can be deflected by a deflecting unit. The scanning can refer to the repeated scanning of different points in the surroundings by means of the light. For example, the number of different points in the surroundings and/or the number of different radiation angles can establish a scanning region.

In various examples, the scanning of light can occur by the temporal superposition and optionally by a spatial superposition of two resonantly driven motions in accordance with different degrees of freedom of at least one mobile support element. Thereby, in various examples, a superposition figure can be traced. Sometimes, the superposition figure is also referred to as a Lissajous figure. The superposition figure can describe a sequence with which different radiation angles are implemented by the motion of the support element.

In various examples, it is possible to scan laser light. Here, for example, coherent or incoherent laser light can be used. It would be possible to use polarized or unpolarized laser light. For example, it would be possible to use the laser light in a pulsed manner. For example, short laser pulses having pulse widths in the range of femtoseconds or picoseconds or nanoseconds can be used. For example, a pulse duration can be in the range of 0.5-3 nanoseconds. The laser light can have a wavelength in the range of 700-1800 nm. For the sake of simplicity, reference is made below primarily to laser light; however, the various examples described herein can also be used for the scanning of light from other light sources, for example, broad-band light sources or RGB light sources. RGB light sources here denote in general light sources in the visible spectrum, wherein the color space is covered by superposition of several different colors—for example, red, green, blue or cyan, magenta, yellow, black.

In various examples, at least one support element having a form- or material-induced resilience is used for the scanning of the light. Therefore, the at least one support element could also be referred to as a spring element. Then, at least one degree of freedom of motion of the at least one support element can be excited, for example, a torsion mode and/or a transverse mode. I.e., a resonant excitation of the corresponding modes occurs. Thereby, a mirror which is connected to a mobile end of the at least one support element can be moved. Therefore, the mobile end of the at least one support element defines an interface element. Thereby, light can be scanned. For example, it would be possible to use more than one single support element, for example, two or three or four support elements. These support elements can optionally be arranged symmetrically with respect to one another.

For example, the mobile end could be moved in one or two dimensions. For this purpose, one or more actuators can be used. For example, it would be possible for the mobile end to be tilted with respect to a fastening means of the at least one support element; this results in a curvature of the at least one support element. This can correspond to a first degree of freedom of motion; this degree of freedom can be referred to as transverse mode (or also sometimes as wiggle mode). Alternatively or additionally, it would be possible to twist the mobile end along a longitudinal axis of the support element (torsion mode). This can correspond to a second degree of freedom of motion. By the motion of the mobile end, it is possible to achieve that laser light is emitted at different angles. For this purpose a deflecting unit such as a mirror, for example, can be provided. Thereby, surroundings can be scanned with the laser light. Depending on the extent of the motion of the mobile end, scanning regions of different size can be implemented.

In the various examples described here, it is possible in each case to excite the torsion mode alternatively or additionally to the transverse mode, i.e., a temporal and spatial superposition of the torsion mode and the transverse mode would be possible. However, this temporal and spatial superposition can also be eliminated. In other examples, other degrees of freedom of motion could also be implemented.

For example, the deflecting unit can be implemented as a prism or a mirror. For example, the mirror could be implemented by a wafer, for example, a silicon wafer, or a glass substrate. For example, the mirror could have a thickness in the range of 0.05 µm-0.1 mm. For example, the mirror could have a thickness of 25 µm or 50 µm. For example, the mirror could have a thickness in the range of 25 µm to 75 µm. For example, the mirror could be designed to be square, rectangular or circular. For example, the mirror could have a diameter of 3 mm to 12 mm or of 8 mm in particular.

In general, such techniques for scanning light can be used in a wide variety of application fields. Examples include endoscopes and RGB projectors and printers. In various examples, LIDAR techniques can be used. The LIDAR techniques can be used to carry out a spatially resolved distance measurement of objects in the surroundings. For example, the LIDAR technique can include measurements of the propagation time of the laser light between the mirror, the object and a detector. In general, such techniques for the scanning of light can be used in a wide variety of application fields. Examples include endoscopes, and RGB projectors and printers. In various examples, LIDAR techniques can be used. The LIDAR techniques can be used to carry out a spatially resolved distance measurement of objects in the surroundings. For example, the LIDAR technique can include measurements of the propagation time of the laser light.

Various examples are based on the finding that it can be desirable to carry out the scanning of the laser light with high accuracy with regard to the radiation angle. For example, in the context of LIDAR techniques, a spatial resolution of the distance measurement can be limited by an inaccuracy of the radiation angle. Typically, a higher (lower) spatial resolution is achieved, the more (less) accurately the radiation angle of the laser light can be determined.

Below, techniques are described for providing a particularly robust laser scanner. In various examples, this is achieved in that scanning module is provided which comprises a support element. Here, the support element is integrally formed with a base and with an interface element configured to secure the mirror surface.

Due to the integrally formed design, it is possible to achieve that a particularly strong flux of force can be transferred via the base to the support element. Thereby, one or more degrees of freedom of motion of the support element can be excited particularly efficiently. Thereby, it can be achieved in turn that the support element performs a motion with a particularly large amplitude. Thereby, large scanning angles can be implemented. In addition, it is avoided that for example an adhesive or another connection means—which would have to be used in the non-integrally formed design—tears or yields, thereby damaging the scanning module.

In order to integrally form the different parts of the scanning module, MEMS techniques can be used. For example, the scanning module could be produced by etching techniques from a wafer. The wafer can have a thickness of, for example, 500 µm. For example, techniques of wet chemical etching or dry etching could be used, for example, reactive ion etching (RIE), for example, dry RIE (DRIE). The wafer can be a silicon wafer or a silicon on insulator (SOI) wafer, for example. The insulator could be arranged approximately 100 µm under a surface of the wafer. Here, the insulator can act, for example, as an etching stop. Here it is possible to use front-side etching and/or back-side etching in order to release the different parts of the scanning module. For example, it would be possible to define etching masks on the wafer by means of lithography. In this manner, in particular, the different parts of the scanning module can be designed to form a single piece/integrally formed and optionally even to be monocrystalline.

Below, techniques are also described for providing a laser scanner which can implement particularly large scanning angles. This is achieved in various examples in that the support element has an extension perpendicular to the mirror surface which is no less than 0.7 mm. In comparison to conventional MEMS-based micromirrors, the support element therefore does not extend only in the plane of the mirror surface, but also has a significant extension perpendicular to the mirror surface. For example, the support element could be designed to be rod shaped along a longitudinal axis, wherein the longitudinal axis has a component perpendicular to the mirror surface. Here, the support element could have local changes of the cross-sectional area, in order to implement a balancing weight.

By means of such techniques, it is possible to achieve that the mirror surface can move particularly freely. Thereby, large amplitudes of motion can be achieved, whereby in turn large scanning angles are made possible.

FIG. 1A illustrates aspects with regard to a scanning module 100. The scanning module 100 comprises a base 141, two support elements 101, 102 and an interface element 142. Here, the base 141, the support elements 101, 102 and the interface element 142 are integrally formed. The support elements 101, 102 are designed in one plane (plane of the drawing of FIG. 1A). In the example of FIG. 1A, the support elements 101, 102 are designed to be straight, i.e., in the resting state they have no curvature or bend. In the various examples described herein, a corresponding straight, rod-shaped configuration of support elements can be used.

For example, it would be possible that the base 141, the support elements 101, 102 and the interface element 142 are obtained by means of MEMS processes by etching a silicon wafer (or another semiconductor substrate). In such a case, the base 141, the support elements 101, 102 and the interface element 142 can be designed in particular to be monocrystalline.

It would be possible that the distance between two adjacent support elements 101, 102 is in the range of 2%-50% of the length 211 of at least one of the at least two support elements, optionally in the range of 10%-40%, moreover optionally in the range of 12-20%. It would be possible that the at least two support elements have lengths 211 which do differ from one another by no more than 10%, optionally by no more than 2%, moreover optionally by no more than 0.1%. Thereby, a particularly large amplitude of corresponding degrees of freedom of motion can be achieved. For example, it would be possible that the longitudinal axes 111, 112 of the support elements 101, 102 in each case pairwise enclose angles with one another which are no greater than 45°, optionally no greater than 10°, moreover optionally no greater than 1°. The support elements 101, 102 have an arrangement with rotational symmetry with respect to a central axis 220. In the example of FIG. 1A, this is a two-fold rotational symmetry.

It would also be possible for the scanning module 100 to have only a single support element or more than two support elements.

FIG. 1A also illustrates aspects with regard to a laser scanner 99. The laser scanner 99 comprises the scanning module 100 and a mirror 150. In the example of FIG. 1A, the mirror 150, which forms on the front side a mirror surface 151 with high reflectivity (for example, more than 95% at a wavelength of 950 µm, optionally >99%, moreover optionally >99.999%; for example, aluminum or gold in a thickness of 80-250 nm) of light 180, is not integrally formed with the base 141, the support elements 101, 102 and the interface element 142. For example, the mirror 150 could be glued to the interface element 142. The interface element 142 can in fact be configured to secure the mirror surface 151. For this purpose, for example, the interface element 142 could have a contact surface which is configured to secure a corresponding contact surface of the mirror 150. In order to connect the mirror 150 to the interface element 142, it would be possible to use, for example, one or more of the following techniques: gluing, soldering.

Between the interface element 142 and the mirror surface 151, a back side 152 of the mirror 150 is arranged. The interface element 142 is arranged on the back side 152 of the mirror 150. From FIG. 1 it can be seen that the support elements extend away from the back side 152 of the mirror 150 to the base 141. Thereby, space-intensive, frame-like structures as in conventional MEMS attachments can be avoided. The mirror 150 can thus be connected via the interface element 142 to the support elements 101, 102. Thereby, a two-piece production is possible, so that no complicated integrated back side structuring as in conventional MEMS attachments has to occur.

By means of such techniques, large mirror surfaces can be implemented, for example, no less than 10 mm^2, optionally no less than 15 mm^2. Thereby, in the context of LIDAR techniques which use the mirror surface 151 also as detector aperture, a high accuracy and range can be achieved.

In the example of FIG. 1A, the support elements 101, 102 have an extension perpendicular to the mirror surface 151;

this extension could be, for example, approximately 2-8 mm, in the example of FIG. 1A. The support elements are designed to be in particular rod-shaped along corresponding longitudinal axes 111, 112. In FIG. 1A, the surface normal 155 of the mirror surface 151 is represented; the longitudinal axes 111, 112 are oriented parallel to the surface normal 155, i.e., they enclose an angle of 0° with said surface normal.

Therefore, the extension of the support elements 101, 102 perpendicular to the mirror surface 151 is equal to the length 211 of the support elements 101, 102. In general, it would be possible for the length 211 of the support elements 101, 102 to be no shorter than 2 mm, optionally no shorter than 4 mm, moreover optionally no shorter than 6 mm. For example, it would be possible for the length of the support elements 101, 102 to be no greater than 20 mm, optionally no greater than 12 mm, moreover optionally no greater than 7 mm. When multiple support elements are used, they can all have the same length.

Depending on the relative orientation of the longitudinal axes 111, 112 with respect to the mirror surface 151, it would also be possible for the extension of the support elements 101, 102 perpendicular to the mirror surface 151 to be shorter than the length 211 thereof (since only the projection parallel to the surface normal 155 is taken into consideration). In general, it would be possible that for extension of the support elements 101, 102 perpendicular to the mirror surface 151 to be no less than 0.7 mm. Such a value is greater than the typical thickness of a wafer from which the scanning module 100 can be produced. Thereby, particularly large scanning angles for the light 180 can be implemented.

The support elements 101, 102 could have, for example, a rectangular cross section. The support elements 101, 102 could also have a square cross section. However, other cross-sectional shapes, such as, for example, circular, triangular, etc., would also be possible. Typical side lengths of the cross section of the support elements 101, 102 can be in the range of 50 μm to 200 μm, optionally they can be approximately 100 μm. The short side of the cross section in general could be no less than 50% of the long side of the cross section; this means that the support elements 101, 102 may be designed not as flat elements. In this manner, it is ensured that the material in the region of the support elements 101, 102 can absorb sufficiently strong tensions without being damaged. However, at the same time, the form-induced resilience of the material in the region of the support elements 101, 102 can assume sufficiently high values to enable a motion of the interface 142 elements with respect to the base 141.

For example, a torsion mode and/or a transverse mode of the support elements 101, 102 could be used in order to move the interface element 142—and thus the mirror 150. Thereby, the scanning of light can be implemented (in FIG. 1A, the resting state of the support elements 101, 102 is represented).

In the example of FIG. 1A, the scanning module 102 comprises support elements 101, 102 which are arranged in one plane (the plane of the drawing of FIG. 1A). By using two support elements 101, 102, the scanning module 100 can be implemented with particularly high robustness. In particular, thereby, the tension for each support element 101, 102 can be reduced. On the other hand, in the case of a single support element, it can be possible to particularly satisfactorily enable two-dimensional scanning of the light 180.

FIG. 1B illustrates aspects with regard to a scanning module 100. The scanning module 100 comprises a base 141, two support elements 101, 102 and an interface element 142. Here, the base 141, the support elements 101, 102 and the interface element 142 are integrally formed.

The example of FIG. 1B here basically corresponds to the example of FIG. 1A. However, in the example of FIG. 1B, the mirror 150 is integrally formed with the interface element 142 or the support elements 101, 102 and the base 141. In order to achieve the largest possible mirror surface 151, in the example of FIG. 1B, a projection beyond a central region of the interface element 142 is provided. Thereby, it can be achieved that the flux of force between the scanning module 100 and the mirror 150 does not have to be transferred via an adhesive.

FIG. 1C illustrates aspects with regard to a scanning module 100. The scanning module 100 comprises a base 141, two support elements 101, 102 and an interface element 142. Here, the base 141, the support elements 101, 102 and the interface element 142 are integrally formed.

The example of FIG. 1C here basically corresponds to the example of FIG. 1B. In the example of FIG. 1C, the mirror 150 and the interface element 142 are implemented by one and the same element. The mirror surface 151 is directly attached to the interface element 142. This enables a particularly simple design.

Figure 2:
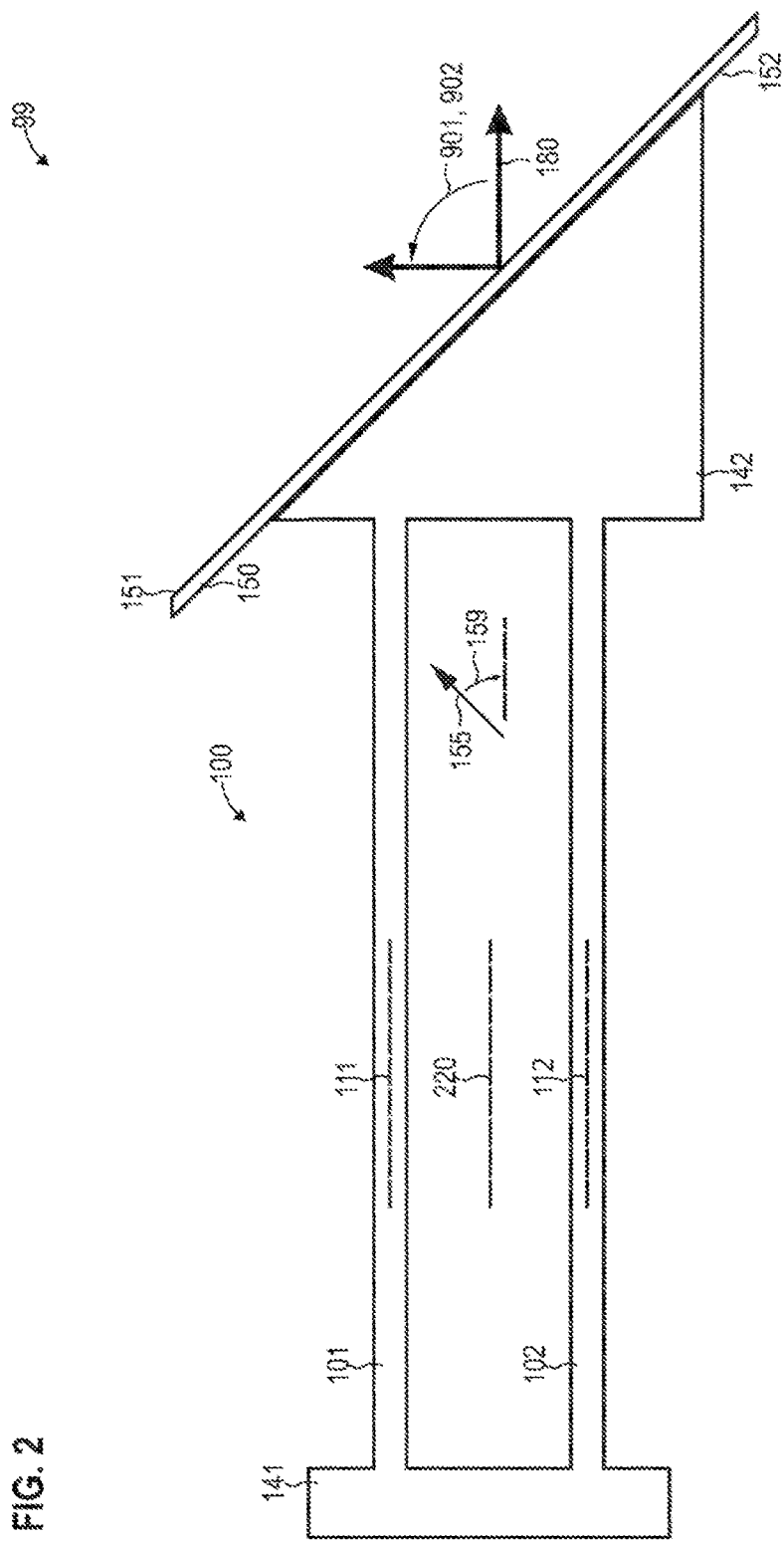
FIG. 2 diagrammatically illustrates a scanning module for a light scanner according to various examples, wherein the scanning module has two support elements arranged parallel to one another, and a mirror not integrally formed and which can be tilted with respect to the longitudinal axis of the support elements.

FIG. 2 illustrates aspects with regard to a scanning module 100. The scanning module 100 comprises a base 141, two support elements 101, 102 and an interface element 142. Here the base 141, the support elements 101, 102 and the interface element 142 are integrally formed.

The example of FIG. 2 here basically corresponds to the example of FIG. 1A. However, in the example of FIG. 2, the longitudinal axes 111, 112 of the support elements 101, 102 are not oriented perpendicularly to the mirror surface 151. In FIG. 2, the angle 159 between the surface normal 155 of the mirror surface 151 and the longitudinal axes 111, 112 is represented. In the example of FIG. 2, the angle 159 is 45°, but in general it could be in the range of −60° to +60°, or optionally in the range of −45°±15° or in the range of +45°±15°, i.e., substantially 45°.

In particular, in FIG. 2, a scenario is represented, in which one beam path of the light 180 extends parallel to the longitudinal axes 111-112 of the support elements 101, 102, and an additional beam path of the light 180—after or before deflection by the mirror surface 151 extends perpendicularly to the longitudinal axes 111-112. In general, the beam path of the light 180 can extend parallel to the central axis 220

Such a tilting of the mirror surface 151 with respect to the longitudinal axes 111, 112 can be particularly advantageous when the torsion mode of the support elements 101, 102 is used for moving the mirror 150. Then, a periscope-like scanning of the light 180 can be implemented.

The periscope-like scanning by means of the torsion mode has the advantage that—to the extent that the mirror 150 is also used as detector aperture—the size of the detector aperture is not dependent on the scanning angle; the angle between incident light and mirror 150 is in fact not dependent on the scanning angle. This is different from reference implementations, in which, due to tilting of the mirror, the size of the detector aperture—and thus the sensitivity of the measurement—varies as a function of the scanning angle.

Figure 3:
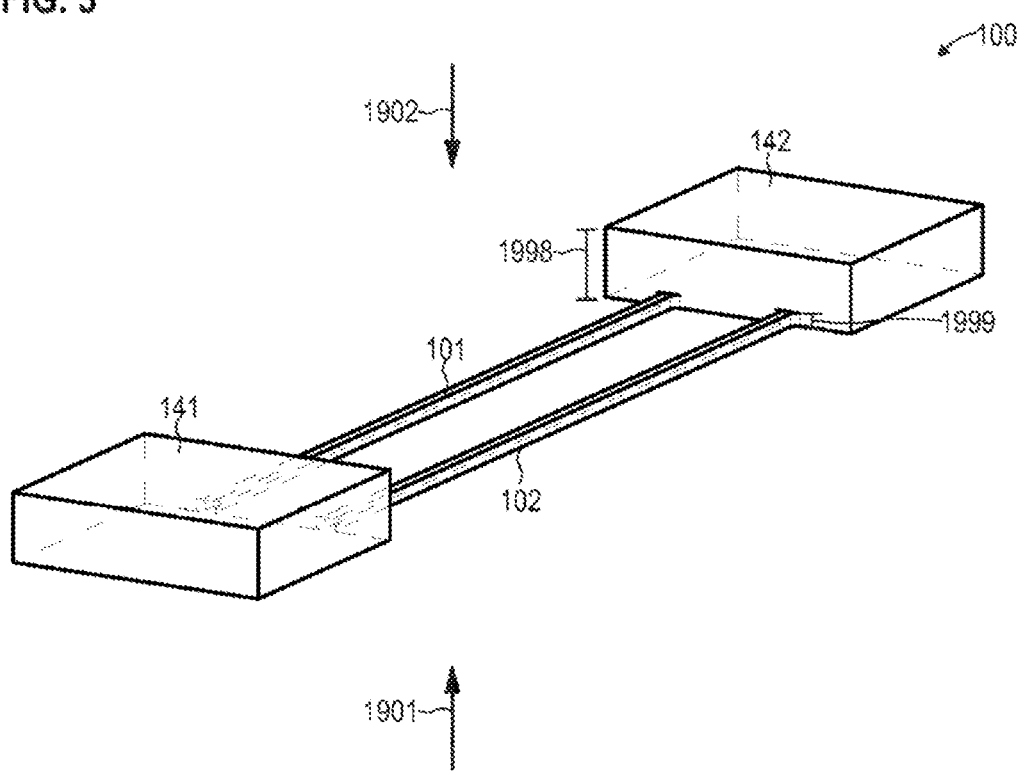
FIG. 3 is a diagrammatic perspective view of a scanning module according to various examples, which has a base, an interface element and two support elements extending between the base and the interface element.

FIG. 3 illustrates aspects with regard to a scanning module 100. The scanning module 100 comprises a base 141, two support elements 101, 102 and an interface element 142. Here, the base 141, the support elements 101, 102 and the interface element 142 are integrally formed. FIG. 3 is a perspective view of the scanning module 100.

In particular, in FIG. 3, the drawing shows how a direction 1901 of the front-side etching and a direction 1902 of the back-side etching are oriented. For example, the scanning module 100 could be produced by appropriate two-step etching of an SOI wafer along the directions 1901, 1902. The boundary surfaces between insulator and silicon could define the support elements 101, 102.

For example, here, the wafer surface could be oriented perpendicularly to the directions 1901, 1902. It follows from a comparison of FIGS. 1A, 1B, 1C, 2 with FIG. 3 that the mirror surface 151 is not oriented perpendicularly to the wafer surface. Thereby, particularly large lengths 211 of the at least one support element 101, 102 can be made possible. This in turn enables large scanning angles.

In the example of FIG. 3, the thickness 1998 of the base 141 and of the interface element 142 is different from the thickness 1999 of the support elements 101, 102. In other examples, it would be possible for the base 141, the interface element 142 and the support elements 101, 102 to have the same thickness. This is with respect to the thicknesses 1998, 1999 in etching direction of the MEMS structuring, i.e., perpendicularly to a wafer normal with regard to the front-side structuring and back-side structuring in directions 1901, 1902. The wafer normal typically correlates with a certain crystal direction.

Figure 4:
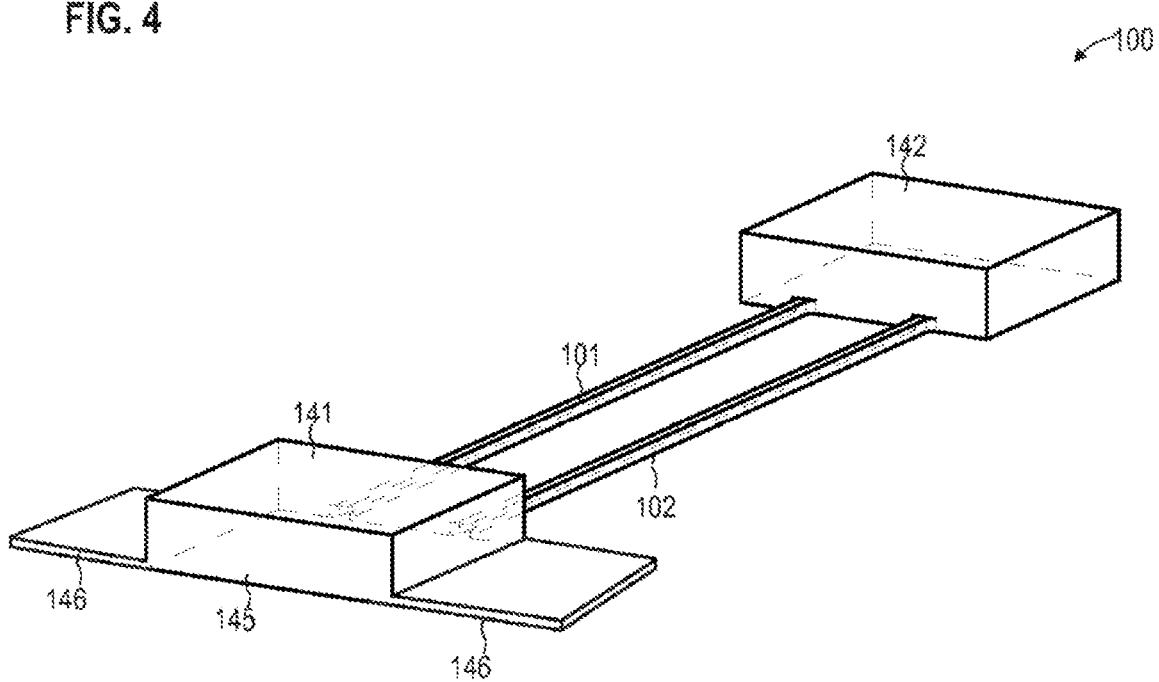
FIG. 4 is a diagrammatic perspective view of a scanning module according to various examples, which has a base, an interface element and two support elements extending between the base and the interface element, wherein the base has two edge regions which are configured to be connected to piezo actuators.

FIG. 4 illustrates aspects with regard to a scanning module 100. The scanning module 100 comprises a base 141, two support elements 101, 102 and an interface element 142. Here, the base 141, the support elements 101, 102 and the interface element 142 are integrally formed. FIG. 4 is a perspective view of the scanning module 100.

The example of FIG. 4 basically corresponds to the example of FIG. 3. In the example of FIG. 4, the base 141 comprises a central region 145 and two edge regions 146 arranged on different sides of the central region 145. The support elements 101, 102 are connected to the central region 145. The central region 145 and the edge regions 146 are all integrally formed.

In the example of FIG. 3, the edge regions 146 have a substantially smaller thickness than the central region 145. For example, the thickness of the edge regions 146 could be no greater than 30% of the thickness of the central region 145. Due to the reduced thickness of the edge regions 146, it can be achieved that they have a greater form-induced resilience than the central region 145. In general, other measures could also be taken in order to achieve that the edge regions 146 have a greater form-induced resilience than the central region 145. For example, recesses or grooves could be provided, which provide the resilience.

The edge regions 146 can be used to establish a connection with piezo actuators. The central region 145 here establishes the connection with the support elements 101, 102.

Figure 5A:
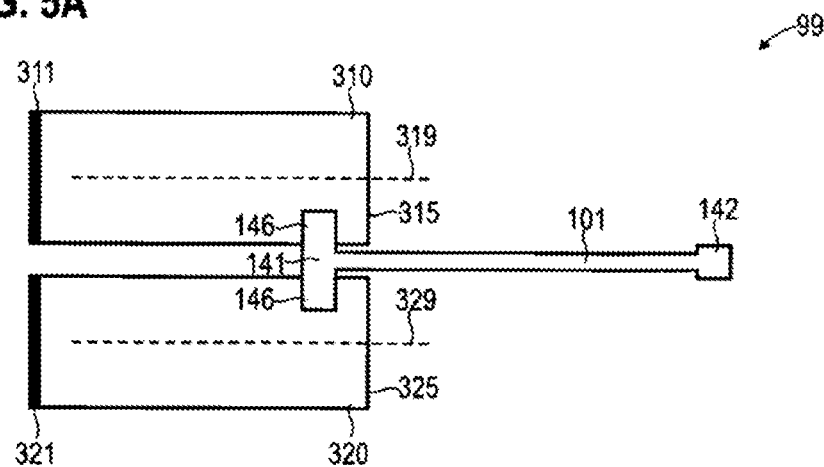
FIG. 5A is a diagrammatic view onto a scanning module according to various examples, wherein the base is connected to two piezo bending actuators.

FIG. 5A illustrates aspects with regard to a laser scanner 99. The laser scanner 99 comprises the scanning module 100 which, for example, could be configured according to the various other examples described herein (however, in FIG. 5A, a scanning module 100 having only a single support element 101 is represented as an example).

FIG. 5A illustrates in particular aspects with regard to piezo actuators 310, 320. In various examples, piezo bending actuators 310, 320 can be used for the excitation of the support element 101.

For example, in general, a first and a second piezo bending actuator can be used. It would be possible for the first piezo bending actuator and/or the second piezo bending actuator to be of plate-shaped design. In general, a thickness of the piezo bending actuators can be, for example, in the range of 200 μm-1 mm, optionally in the range of 300 μm-700 μm. For example, it would be possible that the first piezo bending actuator and/or the second piezo bending actuator has/have a layer structure which comprises an alternating arrangement of multiple piezoelectric materials. Said piezo bending actuators can have a piezoelectric effect of different strength. Thereby, a bending can be brought about, similar to that of a bimetallic strip during temperature changes. For example, it is possible that the first piezo bending actuator and/or the second piezo bending actuator is/are secured at a securing site: an end opposite the securing site can then be moved as a result of a bending or curving of the first piezo bending actuator and/or of the second piezo bending actuator.

By using piezo bending actuators, a particularly efficient and strong excitation can be achieved. The piezo bending actuators in fact can move the base 141 and, in particular— for the excitation of a torsion mode of the at least one support element—tilt said base. In addition, it can be possible to achieve a high integration of the device for the excitation. This can mean that the necessary installation space can be dimensioned to be particularly small.

In particular, in the example of FIG. 5A, the piezo actuators 310, 320 are designed as piezo bending actuators. This means that the application of a tension to electrical contacts of the piezo bending actuators 310, 320 brings about a curving or bending of the piezo bending actuators 310, 320 along the longitudinal axes 319, 329 thereof. For this purpose, the piezo bending actuators 310, 320 have a layer structure (not represented in FIG. 5A and oriented perpendicularly to the plane of the drawing). In this manner, an end 315, 325 of the piezo bending actuators 310, 320 is deflected with respect to a securing site 311, 321 perpendicularly to the respective longitudinal axis 319, 329 (in the example of FIG. 5A, the deflection is oriented perpendicularly to the plane of the drawing). The deflection 399 of the piezo bending actuators 310, 320 as a result of the bending is represented in FIG. 6A.

Figure 6A:
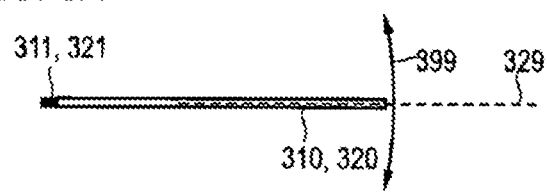
FIG. 6A is a diagrammatic side view of piezo bending actuators according to various examples.

FIG. 6A in a side view of the piezo bending actuators 310, 320. FIG. 6A shows the piezo bending actuators 310, 320 in a resting position, for example, without driver signal or tension/curvature.

Again with regard to FIG. 5A: For example, the securing site in 311, 321 could establish a rigid connection between the piezo bending actuators 310, 320 and a housing of the laser scanner 99 (not represented in FIG. 5A).

The base 141 could have a longitudinal extension of the longitudinal axes 319, 329, which is in the range of 2-20% of the length of the piezo bending actuators 310, 320 along the longitudinal axes 319, 329, optionally in the range of 5-15%. Thereby, a sufficiently strong excitation can be achieved; the base 141 then damps the motion of the piezo bending actuators 310, 320 only relatively weakly.

In the example of FIG. 5A, the piezo bending actuators 310, 320 are arranged substantially parallel to one another. Tilting of the longitudinal axes 319, 329 with respect to one another would also be possible, in particular as long as the tilting occurs in one plane.

From the example of FIG. 5A, it can be seen that the connection of the piezo bending actuators 310, 320 with the support element 101 is implemented via the edge regions 146 of the base 141. Since these edge regions 146 have resilience, the bending 399 can be absorbed and leads to a deflection of the base 141. Thereby, one or more degrees of freedom of motion of the interface element 101 can be excited in a coupled manner via the base 141. Thereby, a particularly efficient and space-saving excitation is achieved.

In the example of FIG. 5A, the piezo bending actuators 310, 320 extend away from the interface element 142. However, it would also be possible for the piezo bending actuators 310, 320 to extend along at least 50% of the length thereof toward the interface element 142. Thereby, a particularly compact arrangement can be achieved. This is shown in FIG. 5B.

Figure 5B:
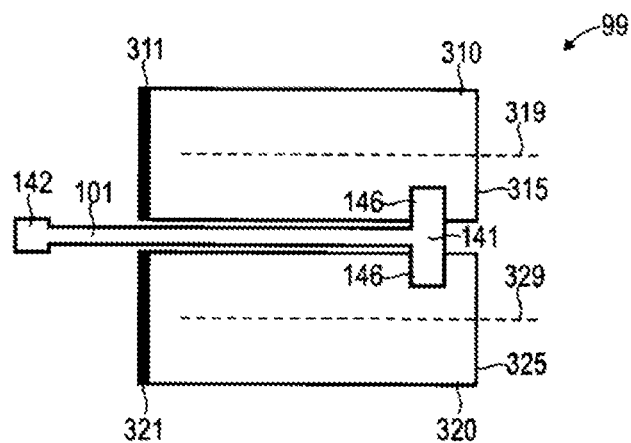
FIG. 5B is a diagrammatic view onto a scanning module according to various examples, wherein the base is connected to two piezo bending actuators.

FIG. 5B illustrates aspects with regard to a laser scanner 99. The laser scanner 99 comprises the scanning module 100 which could be configured for example according to the various other examples described herein (however, in FIG. 5B, a scanning module 100 with only a single support element 101 is represented).

The example of FIG. 5B here basically corresponds to the example of FIG. 5A. However, here the piezo bending actuators 310, 320 extend toward the interface element 142 or toward a freely mobile end of the at least one support element 101. Thereby, a particularly compact structure of the light scanner 99 can be achieved.

It follows from a comparison of FIGS. 5A, 5B, 6A with FIG. 4 that, in the case of excitation via the edge regions 146, a coupled excitation of the multiple support elements 101, 102 occurs. For example, it can be achieved that a piezo bending actuator excites all the support elements 101, 102 together via a flux of force led through the base 141. Correspondingly, this could be achieved in that the flux of force is applied to a magnetic material connected to all the support elements 101, 102 by means of a common magnetic field of a magnetic field coil. Such techniques of coupled excitation have the advantage that an energy efficient and space-saving excitation is enabled. In addition, due to the coupling, it can be prevented that different actuators have to be operated with phase coherence, which simplifies the implementation. Due to the coupled excitation, in particular a coupled torsion mode and/or a coupled transverse mode can be excited.

The actuator can be configured for the direct force action for exciting the degree of freedom of motion, i.e., the use of a parametric excitation—as is the case, for example, in reference implementations with electrostatic interdigital finger structures—can be avoided.

Figure 6B:
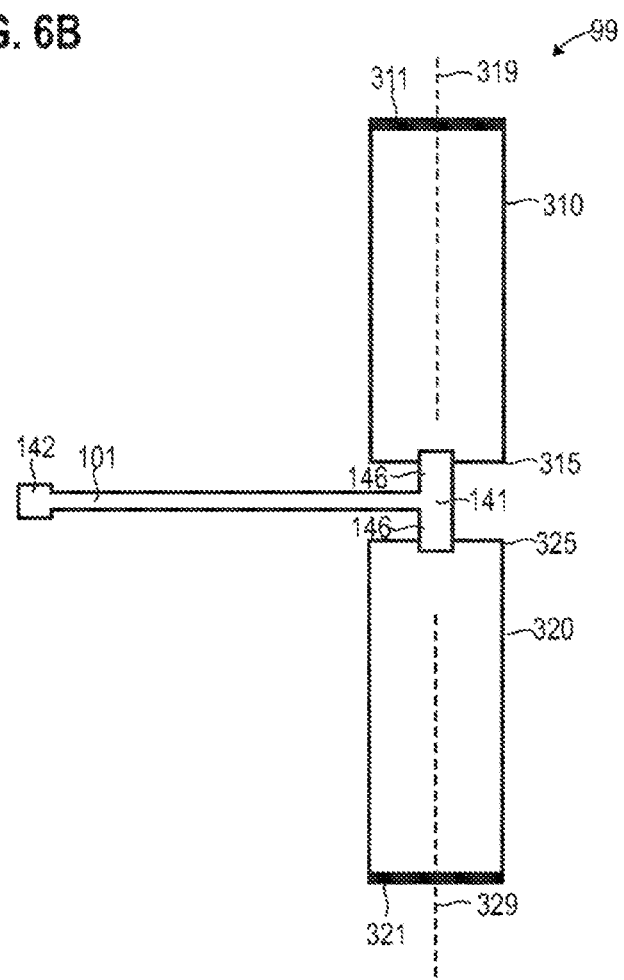
FIG. 6B is a diagrammatic view onto a scanning module according to various examples, wherein the base is connected to two piezo bending actuators.

While, in the examples of FIGS. 5A, 5B and 6A, the longitudinal axes 319, 329 are oriented parallel to the longitudinal axis of the support element 101, it would also be possible in other examples for the longitudinal axes 319, 329 of the piezo bending actuators to be arranged perpendicularly to the longitudinal axis of the support element 101. This is represented in FIG. 6B. In general, the longitudinal axes 319, 329 could enclose an angle of 90°±20° with the longitudinal axis of the at least one support element, optionally of 90°±5°, moreover optionally of 90°±1°.

Figure 7:
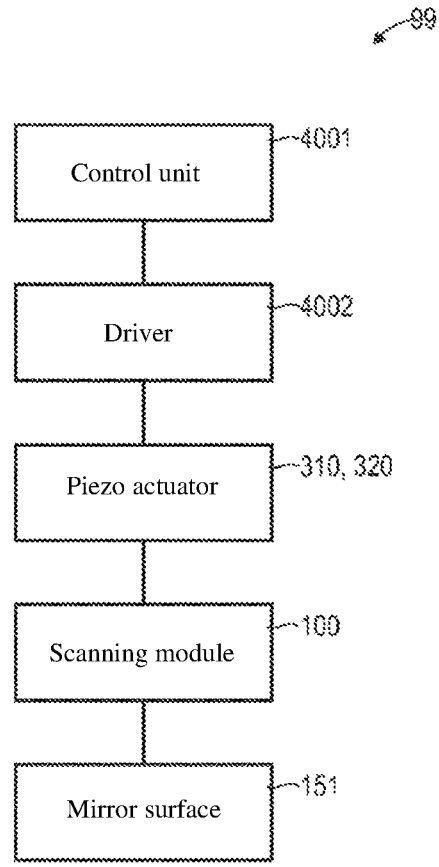
FIG. 7 diagrammatically illustrates a light scanner according to various examples.

FIG. 7 illustrates aspects with regard to a laser scanner 99. The laser scanner 99 comprises a control unit 4001 which could be implemented, for example, as a microprocessor or application specific integrated circuit (ASIC). The control unit 4001 could also be implemented as a field programmable array (FPGA). The control unit 4001 is configured to output control signals to a driver 4002. For example, the control signals could be output in digital or analog form.

The driver 4002 in turn is configured to generate one or more voltage signals and to output said voltage signals at corresponding electrical contacts of the piezo actuators 310, 320. Typical amplitudes of the voltage signals are in the range of 50 V to 250 V.

The piezo actuators 310, 320 in turn are coupled to the scanning module 100, as described above with regard to FIGS. 5 and 6, for example. Thereby, one or more degrees of freedom of motion of the scanning module 100, in particular of one or more support elements 101, 102 of the scanning module 100, can be excited. Thereby, the mirror surface 151 is deflected. Thereby, the surrounding region of the laser scanner 99 can be scanned with light 180.

Figure 8:
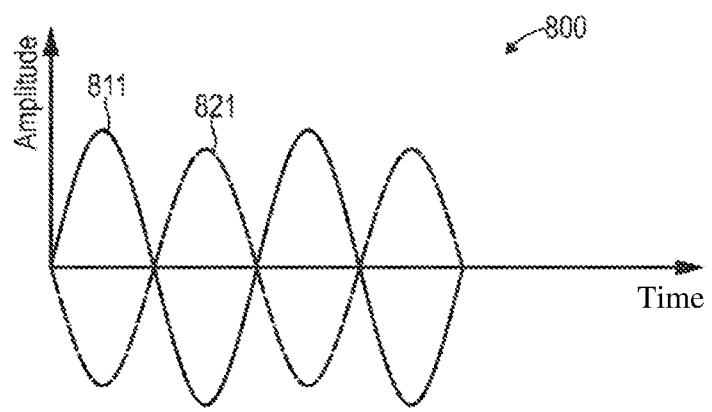
FIG. 8 diagrammatically illustrates out-of-phase signal forms which can be used for operating piezo bending actuators according to various examples.

FIG. 8 illustrates aspects with regard to signal forms 800 which can be used in order to control the piezo actuators 310, 320 according to various examples described herein. For example, the signal forms 800 can be output by the driver 4002. FIG. 8 plots in particular the amplitude of the signal forms 800 as a function of time.

In the example of FIG. 8, a signal contribution 811 (solid line) is represented, which is used to control the piezo bending actuators 310. In addition, in the example of FIG. 8, a signal contribution 821 (dashed line) is represented, which is used to control the piezo bending actuators 320. From the example of FIG. 8, it can be seen that the signal contributions 811, 821 are configured to be out-of-phase. In the example of FIG. 8, this means that the signal contributions 811, 821 have the same frequency as well as a phase shift of 180°.

Thereby, it can be achieved that the bending piezo bending actuators 310 are curved or moved upward (curved or moved downward), while the piezo bending actuators 320 are curved or moved downward (curved or moved upward). Thereby, it can be achieved in turn that the base 141 is tilted alternatingly to the left and to the right (with respect to a central axis 220 of one or more support elements 101, 102). Therefore, with such a configuration of the signal forms 800, a particularly efficient excitation of the torsion mode of the support element or of the support elements 101, 102 can be achieved.

Figure 9:
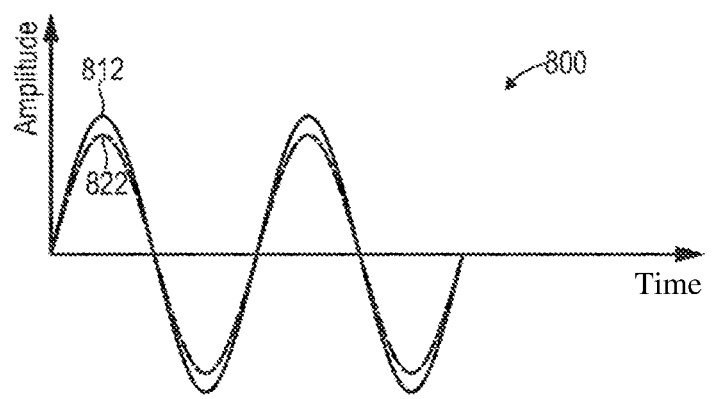
FIG. 9 diagrammatically illustrates in-phase signal forms which can be used for operating piezo bending actuators according to various examples.

FIG. 9 illustrates aspects with regard to signal forms 800, which can be used to control the piezo bending actuators 310, 320 according to various examples described herein. FIG. 9 plots in particular the amplitude of the signal forms 800 as a function of time.

In the example of FIG. 9, a signal contribution 812 (solid line) is represented, which is used to control the piezo bending actuators 310. In addition, in the example of FIG. 9, a signal contribution 822 (dashed line) is represented, which is used to control the piezo bending actuators 320. From the example of FIG. 9, it can be seen that the signal contributions 812, 822 are configured to be in-phase. In the example of FIG. 9, this means that the signal contributions 812, 822 have the same frequency and a phase shift of 0°. In some examples, it would be possible for the in-phase signal contributions 812, 822 to have an amplitude modulation.

Due to the in-phase signal contributions 812, 822, it can be achieved that the piezo bending actuators 310 are curved or moved upward (curved or moved downward), while the piezo bending actuators 320 are curved or moved upward (curved or moved downward). As a result, it can in turn be achieved that the base 141 is moved alternatingly upward and downward (with respect to the central axis 220). Therefore, by means of such a configuration of the signal forms 800, a particularly efficient excitation of transverse modes of the support element or of the support elements 101, 102 can occur.

In some examples, it would be possible for the signal contributions 811, 821 to be applied temporally superposed with the signal contributions in 812, 822. This can be desirable in particular if only a single support element is used. Then, a temporal and spatial superposition of a torsion mode and a transverse mode of the at least one support element can be obtained. Thereby it can be achieved that a two-dimensional scanning region is scanned, wherein the light is deflected at the single mirror surface. This can achieve a particularly space-saving integration of the laser scanner 99.

In other examples, it would also be possible for either the out-of-phase signal contributions 811, 821 or else the in-phase signal contributions 812, 822 to be applied. This can be particularly desirable if more than a single support element is used. Then, either the torsion mode or the transverse mode of the at least one support element can be excited. Thereby, by deflection at the mirror surface, a one-dimensional scanning region can be scanned. In order to nevertheless scan a two-dimensional scanning region, it would be possible, for example, that two laser scanners sequentially deflect the light; here, the two laser scanners can be operated in a synchronized manner.

However, below, reference is made primarily to scenarios in which a temporal or //and// spatial superposition of different degrees of freedom of motion of the at least one support element is used to scan a two-dimensional scanning region.

A typical frequency of the signal contributions 811, 812, 821, 822 is, for example, in the range of 50 Hz to 1.5 kHz, optionally in the range of 200 Hz to 1 kHz, moreover optionally in the range of 500 Hz to 700 Hz. In this manner, appropriate scanning frequencies can be achieved.

In the examples of FIGS. 8 and 9, scenarios are illustrated in which, for the excitation of the piezo bending actuators 310, 320, the out-of-phase signal contributions 811, 821 have approximately the same frequency as the in-phase signal contributions 812, 822. In general, it would be possible that for the out-of-phase signal contributions 811, 821 to have a first frequency in the range of 95-105% of a second frequency of the in-phase signal contributions 812, 822. By means of such an implementation of the frequencies of the signal forms 800, it can be achieved that a particularly efficient superposition figure of the different degrees of freedom of motion of the at least one support element 101, 102 can be achieved.

In particular, it can be achieved that a high refresh rate can be achieved, without certain regions of the scanning region being scanned multiple times by nodes in the superposition figure. In particular, such implementations of the frequencies of the signal forms 800 can exploit the fact that a degeneration of the different excited degrees of freedom of motion of the at least one support element 101, 102 in the frequency space is present. For example, it is possible that a degeneration of the frequency of the torsion mode of the at least one support element 101, 102 and of the frequency of the transverse mode of the at least one support element 101, 102 can be achieved by an appropriate configuration of one or more of the following parameters: length 211 of the at least one support element 101, 102; moment of inertia of the at least one support element 101, 102 and/or a balancing weight which is attached to the at least one support element 101, 102, and moment of inertia of the interface element 142 and/or of the mirror 150.

However, in other examples, it would be possible for the out-of-phase signal contributions 811, 821 to have a first frequency other than the second frequency of the in-phase signal contributions 812, 822. For example, the first frequency of the out-of-phase signal contributions 811, 821 could be in the range of 45-55% of the second frequency of the in-phase signal contributions 812, 822, i.e., approximately half of the second frequency. In other examples, the first frequency could also be double the second frequency and assume an entirely different value. By such an elimination of the degeneration between the different degrees of freedom of motion of the at least one support element 101, 102, which are excited by the out-of-phase signal contributions 811, 821 and in-phase signal contributions 812, 822, non-linear interactions between the corresponding degrees of freedom of motion can be avoided. For example, the formation of a parametric oscillator by the transverse modes and/or the torsion mode can be avoided. Thereby, a particularly targeted excitation of the at least one support element 101, 102 can be achieved.

Due to the superposition of the in-phase signal contributions 811, 821 with the out-of-phase signal contributions 812, 822, it can be achieved that the signal forms 800 on the piezo bending actuators 810 have a certain phase shift with respect to the signal forms 800 on the piezo bending actuators 820. This phase shift can be varied, for example, as a function of the relative amplitude of the in-phase signal contributions 811, 821 and the out-of-phase signal contributions 812, 822 with respect to one another. In other words, the actual signal forms 800 can be decomposed into the in-phase signal contributions 811, 821 and the out-of-phase signal contributions 812, 822. In some examples, a driver used for generating the signal forms 800 can already generate the superposition of the in-phase signal contributions 811, 821 with the out-of-phase signal contributions 812, 822.

Figure 10:
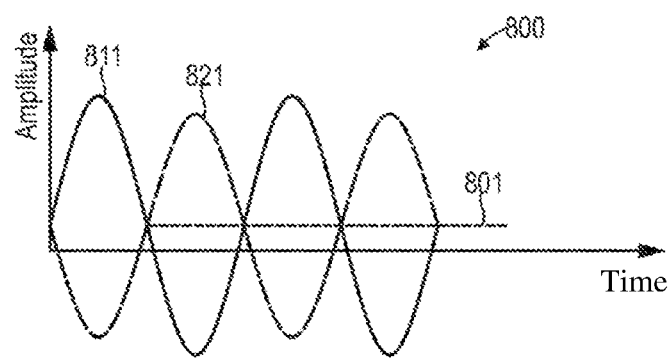
FIG. 10 diagrammatically illustrates out-of-phase signal forms with DC portion, which can be used for operating piezo bending actuators according to various examples.

FIG. 10 illustrates aspects with regard to signal forms 800 which can be used to control the piezo bending actuators 310, 320 according to various examples described herein. FIG. 10 plots in particular the amplitude of the signal forms 800 as a function of time.

The example of FIG. 10 basically corresponds to the example of FIG. 8. However, in the example of FIG. 10, the signal contributions 811, 821 have a respective DC portion 801. In some examples, it would also be possible that only one of the signal contributions 811, 821 has a DC portion 801 (horizontal dashed line in FIG. 10). In some examples, it would also be possible for the two signal contributions 811, 821 to have differently dimensioned DC portions 801, for example, in terms of magnitude and/or sign.

Due to the provision of the DC portion 801, it can be achieved that a bias of the at least one support element 101, 102—i.e., a DC deflection of the at least one support element 101, 102 is achieved. Thereby, for example, an offset of the at least one support element and/or specifications for the field of view of the corresponding scanner can be compensated or taken into consideration.

Figure 11:
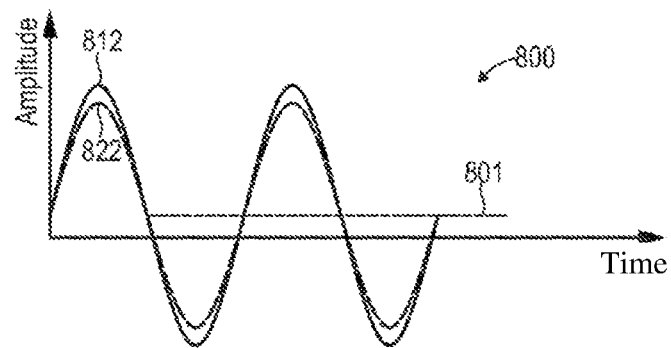
FIG. 11 diagrammatically illustrates in-phase signal forms with DC portion, which can be used for operating piezo bending actuators according to various examples.

FIG. 11 illustrates aspects with regard to signal forms 800 which can be used to control the piezo bending actuators 310, 320 according to various examples described herein. FIG. 11 plots in particular the amplitude of the signal forms 200 as a function of time.

The example of FIG. 11 basically corresponds to the example of FIG. 9. However, in the example of FIG. 11, the signal contributions 812, 822 have a respective DC portion 801. In general, it is possible that only some of the signal contributions 812, 822 have a DC portion 801. Different signal contributions can also have different DC portions.

Figure 12:
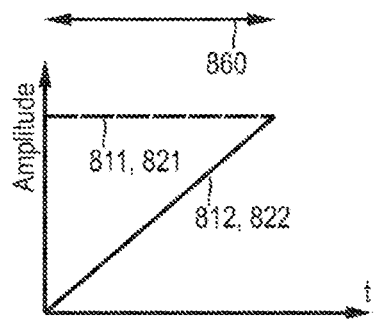
FIG. 12 diagrammatically illustrates an amplitude modulation of in-phase signal forms as a function of time according to various examples.

FIG. 12 illustrates aspects with regard to an amplitude modulation of the signal contributions 812, 822. In particular, FIG. 12 illustrates the amplitude of the signal contributions 812, 822 as a function of time.

In the example of FIG. 12, the time duration 860 is represented, which is necessary for scanning a superposition figure. This means that the time duration 860 can correspond to a refresh rate of the laser scanner 99.

From FIG. 12, it can be seen that the amplitude of the in-phase signal contributions 812, 822 increases monotonically and continuously as a function of time during the time duration 860. However, the amplitude could also increase stepwise. The amplitude could also decrease monotonically.

FIG. 12 also illustrates aspects with regard to an amplitude modulation of the signal contributions 811, 821. From FIG. 12, it can be seen that the amplitude of the out-of-phase signal contributions 811, 821 does not vary.

By such techniques, a particularly efficient scanning of the laser light can be implemented. In particular, it can be possible that a superposition figure is obtained which has no nodes or at least only few nodes. Thereby, a large scanning region can be scanned with a high refresh rate.

It has been observed that particularly good results can be achieved if a continuous amplitude modulation without jumps is selected. Particularly good results can be achieved in particular in the case of a sine- or cosine-shaped amplitude modulation. Then in particular, non-linear effects are suppressed particularly satisfactorily. A particularly well defined superposition figure can be obtained.

Figure 13:
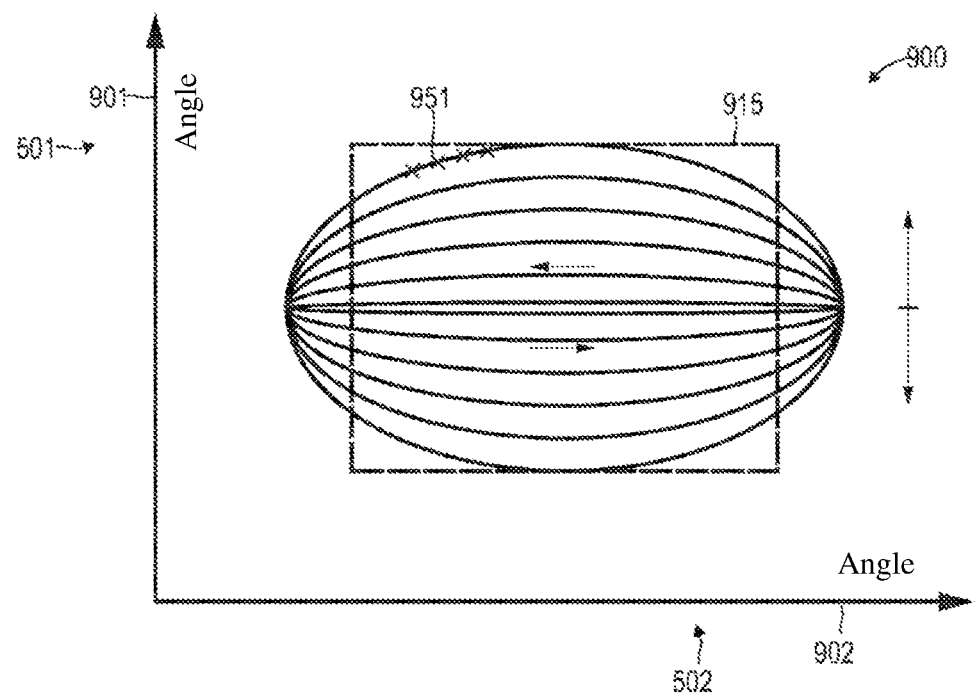
FIG. 13 diagrammatically illustrates a superposition figure for two degrees of freedom of motion of at least one support element and a scanning region defined by the superposition figure according to various examples.

FIG. 13 illustrates aspects with regard to a superposition FIG. 900. FIG. 13 illustrates in particular aspects with regard to a scanning region 915 (dashed line in FIG. 13) which is defined by the superposition FIG. 900. FIG. 13 here shows the scanning angle 901 which can be achieved by a first degree of freedom of motion 501 of the at least one support element 101, 102. FIG. 13 also shows the scanning angle 902 which can be achieved by a second degree of freedom of motion 502 of the at least one support element 101, 102 (the scanning angles are also indicated in FIG. 1, for example).

For example, it would be possible for the first degree of freedom of motion 501 to correspond to a transverse mode of the at least one support element 101, 102. Then, it would be possible for the transverse mode 501 to be excited by the in-phase signal contributions 812, 822. Correspondingly, it would be possible for the degree of freedom of motion 902 to correspond to a torsion mode of the at least one support element 101, 102. Then, it would be possible that the torsion mode 502 is excited by the out-of-phase signal contributions 811, 821.

The superposition FIG. 900 according to the example of FIG. 13 is obtained if the transverse mode 501 and the torsion mode 902 have the same frequency. In addition, the superposition FIG. 900 according to the example of FIG. 13 is then obtained if the amplitude of the transverse mode 501 is increased by the amplitude modulation of the in-phase signal contributions 812, 822 (compare FIG. 12) during the time duration 860. Thereby, it is in fact achieved that the superposition FIG. 900 in the form of an "opening eye" is obtained, i.e., with increasing amplitude of the transverse mode 501 greater scanning angles 901 are obtained (represented by the vertical dotted arrows in FIG. 13). Thereby, scanning lines can be obtained (horizontal dotted arrows in FIG. 13), by means of which the surroundings of the laser scanner 99 can be scanned. By repeated emission of light pulses, different image points 951 can then be obtained. Superposition figures with multiple nodes are avoided, whereby a particularly high refresh rate can be achieved. In addition, it is avoided that certain regions between the nodes are not scanned.

Figure 14:
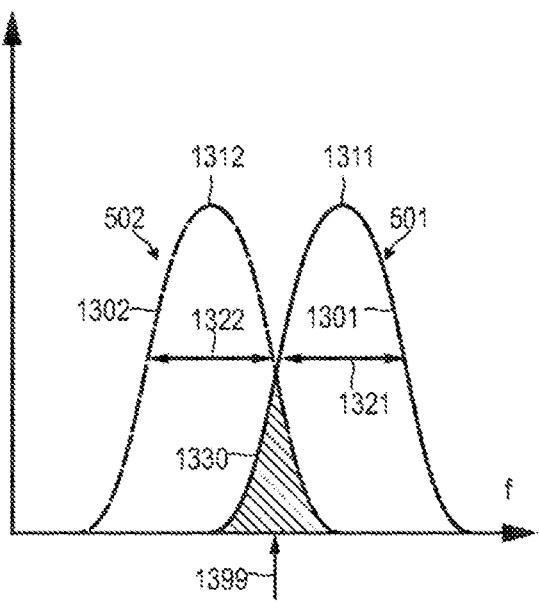

FIG. 14 illustrates aspects with regard to resonance curves 1301, 1302 of the degrees of freedom of motion 501, 502 which, for example, can implement the superposition FIG. 900 according to the example of FIG. 13. FIG. 14 here illustrates the amplitude of the excitation of the respective degree of freedom of motion 501, 502. A resonance spectrum according to the example of FIG. 14 can be particularly desirable, if a temporal and spatial superposition of the different degrees of freedom of motion 501, 502 of the at least one support element 101, 102 is desired for the two-dimensional scanning.

The resonance curve 1301 of the transverse mode 501 has a maximum 1311 (solid line). In FIG. 14, the resonance curve 1302 of the torsion mode 502 is also represented (dashed line). The resonance curve 1302 has a maximum 1312.

The maximum 1312 of the torsion mode 502 is at a lower frequency than the maximum 1311 of the transverse mode, which could be the transverse mode 501 of lowest order, for example. The torsion mode 502 can thus form the fundamental mode of the system. Thereby, it can be achieved that the scanning module is particularly robust with respect to external interfering influences such as vibrations, etc. This is the case, since such external excitations typically excite the transverse mode 501 particularly efficiently, while, on the other hand, not exciting the torsion mode 502 particularly efficiently.

For example, the resonance curves 1301, 1302 could be of Lorentzian form. This would be the case if the corresponding degrees of freedom of motion 501, 502 can be described by a harmonic oscillator.

The maxima 1311, 1312 are shifted with respect to one another in terms of frequency. For example, the frequency spacing between the maxima 1311, 1312 could be in the range of 5 Hz to 20 Hz.

In FIG. 14, the full widths at half maximum 1321, 1322 of the resonance curves 1301, 1302 are also represented. Typically, the full width at half maximum is defined by the damping of the corresponding degree of freedom of motion 501, 502. In the example of FIG. 14, the full widths at half maximum 1321, 1322 are identical; however, in general, the full widths at half maximum 1321, 1322 could be different from one another. In some examples, different techniques can be used in order to increase the full widths at half maximum 1321, 1322. For example, a corresponding adhesive could be provided, of which certain sites are arranged, for example, between the piezo bending actuators 310, 320 and the base 141.

In the example of FIG. 14, the resonance curves 1301, 1302 have an overlap region 1330 (represented shaded). This means that the transverse mode 501 and the torsion mode 502 are degenerated. In the overlap region 1330, both the resonance curve 1301 and the resonance curve 1302 have significant amplitudes. For example, it would be possible for the amplitudes of the resonance curves 1301, 1302 in the overlap region to be in each case no less than 10% of the corresponding amplitudes at the respective maximum 1311, 1312, optionally in each case not <5%, moreover optionally in each case not <1%. By means of the overlap region 1330, it can be achieved that the two degrees of freedom of motion 501, 502 can be excited in a coupled manner, namely in each case in a semi-resonant manner at a frequency 1399. The frequency 1399 is between the two maxima 1311, 1312. Thereby, the temporal and spatial superposition can be achieved. However, on the other hand, nonlinear effects can be suppressed or avoided by coupling between the two degrees of freedom of motion 501, 502.

Figure 15:
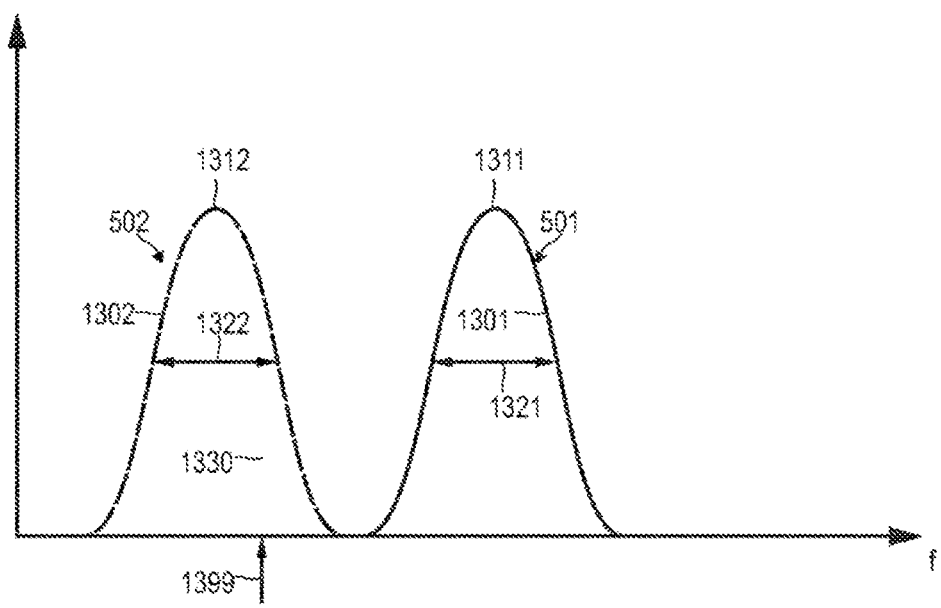

FIG. 15 illustrates aspects with regard to resonance curves 1301, 1302 of the degrees of freedom of motion 501, 502. In the example of FIG. 15, the two degrees of freedom of motion 501, 502 have no overlap regions. There is an eliminated degeneration. Therefore, when the excitation frequency 1399 is used, only the torsion mode 502 is excited. This can be desirable if the scanning module is to implement only one-dimensional scanning. This can be desirable particularly when more than one support element is used.

For example, the degree of freedom of motion 502 can correspond to a torsion mode. The torsion mode 502 can form a fundamental mode of the kinematic system, i.e., it is possible that no additional degrees of freedom of motion with smaller natural frequencies are present.

Due to the semi-resonant excitation to the sides of the maximum 1312, non-linear effects can be prevented.

For adjusting or shifting the resonance curves 1301, 1302, one or more balancing weights can be provided, which, for example, can be integrally formed with the at least one support element 101, 102. A corresponding example is represented in FIG. 16.

Figure 16:
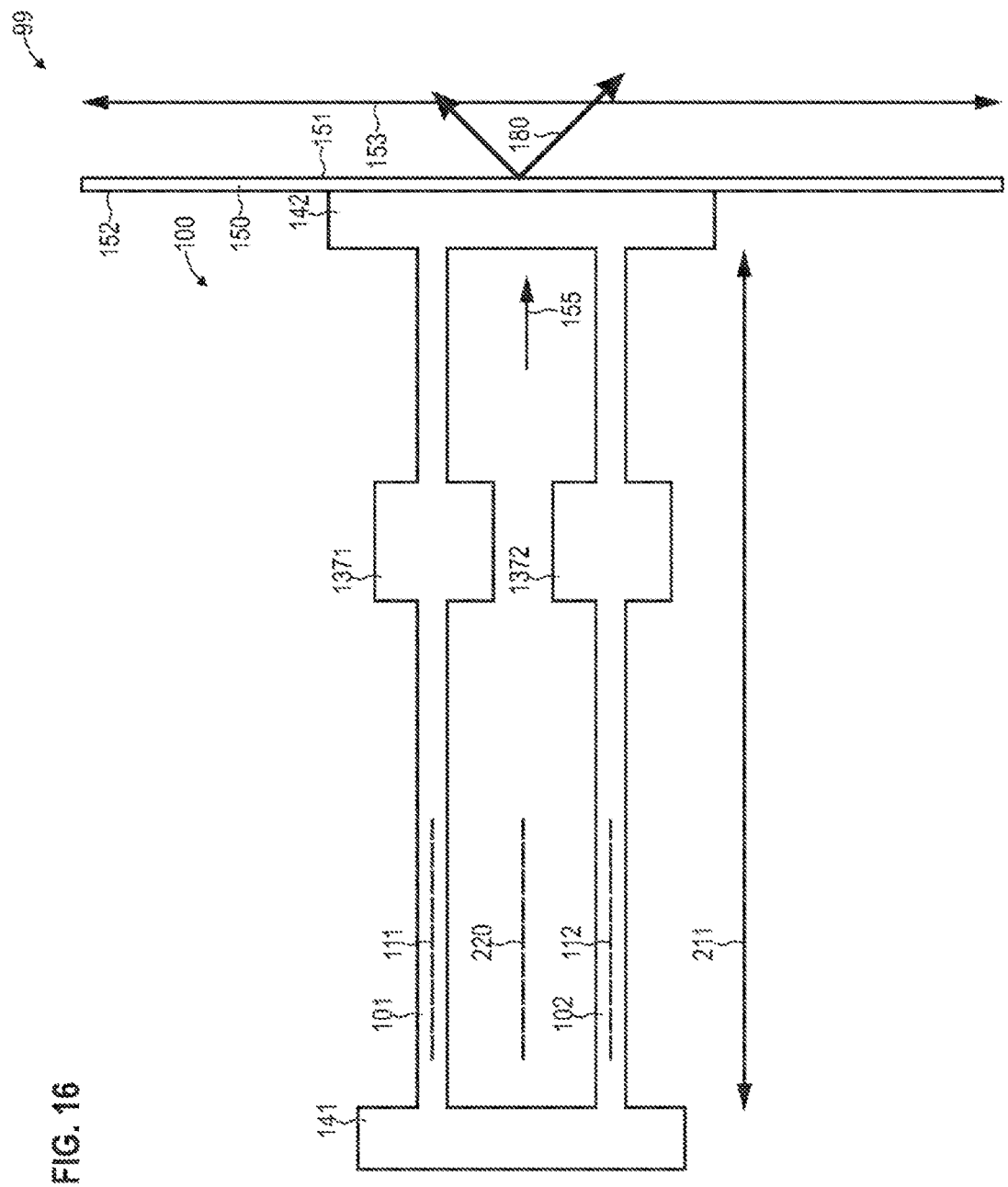
FIG. 16 diagrammatically illustrates a scanning module for a light scanner according to various examples, wherein the scanning module in the example of FIG. 15 has two support elements arranged parallel to one another with respective balancing weight.

The example of FIG. 16 basically corresponds to the example of FIG. 1. However, in the example of FIG. 16, balancing weights 1371, 1372 are provided on the support elements 101, 102. The balancing weights 1371, 1372 are integrally formed with the support elements 101, 102. Due to the balancing weights 1371, 1372, the frequency of the torsion mode 502 can be changed. The balancing weights 1371, 1372 correspond to a local enlargement of the cross section of the rod-shaped support elements 101, 102.

Figure 17:
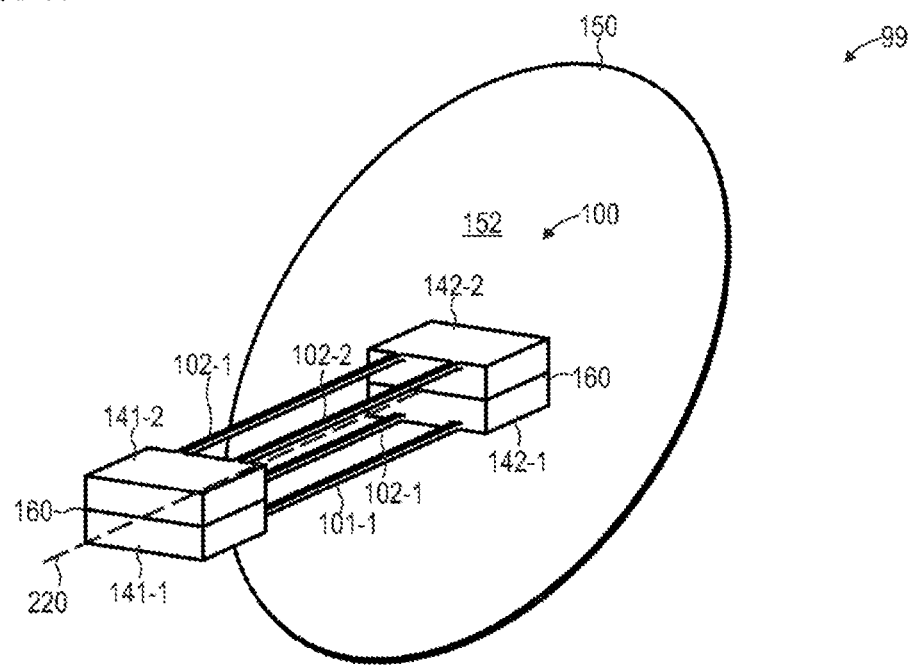
FIG. 17 is a perspective view of a scanning module for a light scanner according to various examples, wherein the scanning module has two pairs of support elements in different planes.

FIG. 17 illustrates aspects with regard to a laser scanner 99. In the example of FIG. 17, a scanning module 100 is represented, which comprises a first pair of support elements 101-1, 102-1 and a second pair of support elements 102-1, 102-2. The first pair of support elements 101-1, 102-1 is arranged in a plane; the second pair of support elements 101-1, 102-2 is also arranged in a plane. These planes are arranged parallel to one another and offset with respect to one another.

Each pair of support elements is here associated with a corresponding base 141-1, 141-2 and a corresponding interface element 142-1, 142-2. The two interface elements 142-1, 142-2 here establish a connection with a mirror 150. In this manner, it can be achieved that a particularly stable scanning module 100 is provided, which has a large number of support elements. In particular, the scanning module 100 can comprise support elements which are arranged in different planes. This can enable a particularly high robustness.

From FIG. 17, it can also be seen that the base 141-1 is not integrally formed with the base 141-2. In addition, the interface element 142-1 is not integrally formed with the interface element 142-2. The support elements 101-1, 102-1 are not designed to form a single with the support elements 102-1, 102-2. In particular, it would be possible that the different above-mentioned parts are produced from different regions of a wafer and are subsequently connected to one another by gluing or anodic bonding, for example. Other examples for connection techniques comprise: fusion bonding, fusion or direct bonding, eutectic bonding, thermocompression bonding, and adhesive bonding. Corresponding connection surfaces 160 are marked in FIG. 17. By means of such techniques, it is possible to achieve that the scanning module 100 can be produced particularly simply. In particular, it is not necessary that the complete scanning module 100 is produced in the form of a single piece or integrally from a wafer. Instead, the scanning module 100 can be generated in a two-step production process. At the same time however, this cannot significantly lower the robustness; due to the large-area connection surfaces 160, a particularly stable connection between the base 141-1 and of the base 141-2 and respectively between the interface element 142-1 and the interface element 142-2 can be produced.

In the example of FIG. 17, the base 141-1 is directly connected to the base 141-2; in addition, the interface element 142-1 is directly connected to the interface element 142-2. This is made possible by the thickness variation in comparison to the support elements 101-1, 101-2, 102-1, 102-2 (compare FIG. 3). In other examples, the base 141-1, the base 141-2, the interface element 142-1, the interface element 142-2 and the support elements 101-1, 101-2, 102-1, 102-2 can all have the same thickness; then, connection via spacers could occur (not shown in FIG. 17).

In the scenario of FIG. 17, it is possible for the base 141-1, the support elements 101-1, 102-1, and the interface element 142-1 to be reproduced by mirroring at a plane of symmetry (in which the connection surfaces 160 are also located) onto the base 141-2, the support elements 102-1, 102-2 and the interface element 142-2. Thereby, a highly symmetric structure can be achieved. In particular, a rotationally symmetric structure can be achieved. The rotational symmetry can have an order n=4; i.e., equal to the number of support elements 101-1, 101-2, 102-1, 102-2 used. Such a symmetric structure with respect to the central axis 220 can in particular have advantages with regard to the excitation of the torsion mode 502. Non-linearities can be avoided.

Figure 18:
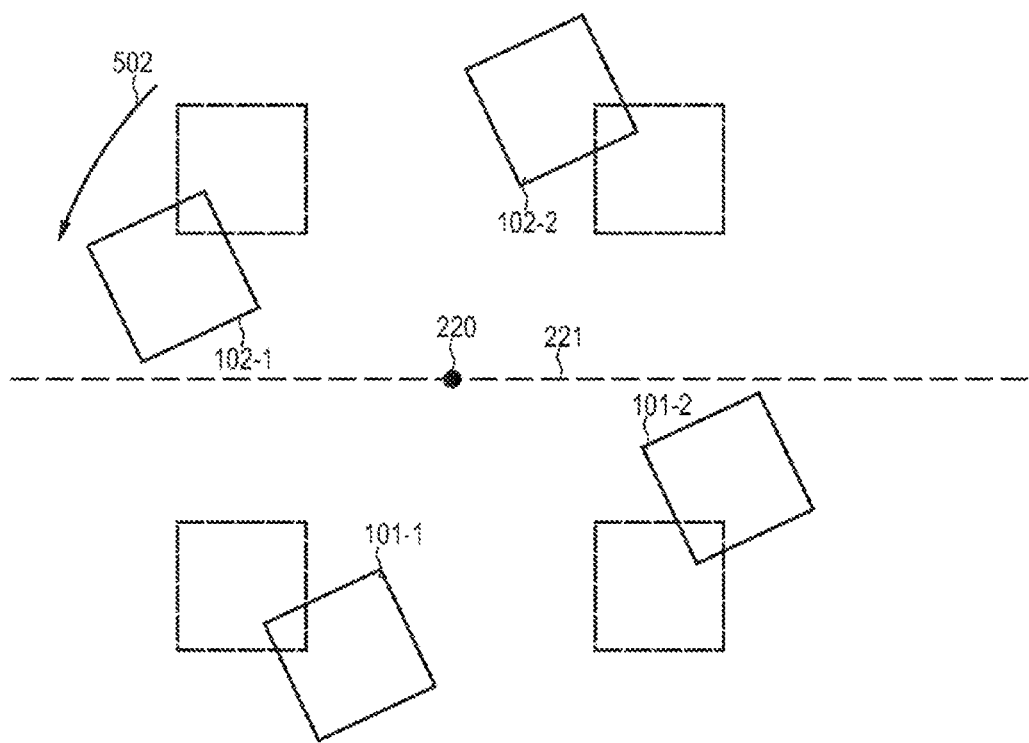
FIG. 18 diagrammatically illustrates a torsion mode for the scanning module according to the example of FIG. 17.

FIG. 18 illustrates aspects with regard to the torsion mode 502. FIG. 18 diagrammatically illustrates the deflection of the torsion mode 502 for the scanning module 100 according to the example of FIG. 17 (in FIG. 18, the deflected state is represented with solid lines and the resting state is represented with dashed lines).

In FIG. 18, the rotation axis 220 of the torsion mode 502 is represented. The rotation axis 220 lies in the plane of symmetry 221 which reproduces the base 141-1 onto the base 141-2 or the support elements 101-1, 101-2 onto the support elements 102-1, 102-2.

The multiple support elements 101-1, 101-2, 102-1, 102-2 thus are twisted (I) both into one another along the central axis 220; and also (II) in each case individually along the longitudinal axes thereof. Therefore, the torsion mode 502 can also be referred to as coupled torsion mode 502 of the support elements 101-1, 101-2, 102-1, 102-2. This is promoted by the geometric arrangement of the support elements 101-1, 101-2, 102-1, 102-2 with respect to one another, namely in particular by the parallel arrangement of the support elements 101-1, 101-2, 102-1, 102-2 with respect to one another—that is to say with a particularly small distance between the support elements 101-1, 101-2, 102-1, 102-2 in comparison to the length thereof. This coupled torsion mode 502 can be referred to as parallel kinematics of the support elements 101-1, 101-2, 102-1, 102-2.

In the example of FIG. 18, the support elements 101-1, 102-1, 101-2, 102-2 are arranged rotationally symmetrically with respect to a central axis 220. In particular, a four-fold rotational symmetry is present. The presence of a rotational symmetry means, for example, that the system of the support elements 101-1, 102-1, 101-2, 102-2 can be brought into superposition with itself by rotation. The order of the rotational symmetry denotes how often per 360° rotation angle the system of the support elements 101-1, 102-1, 101-2, 102-2 can be brought into superposition with itself. In general, the rotational symmetry could be n-fold, where n denotes the number of support elements used.

Due to the rotationally symmetric arrangement of high order, the following effect can be achieved: In the case of excitation of the torsion mode 502, nonlinearities can be reduced or suppressed. The plausibility of this can be shown by the following example: for example, the support elements 101-1, 102-1, 101-2, 102-2 could be arranged in such a manner that the longitudinal axes and the central axis 220 all lie in one plane. The rotational symmetry would then be two-fold (and not four-fold as in the example of FIG. 18). In such a case, the orthogonal transverse modes 501 (different directions perpendicular to the central axis 220) have different frequencies—due to different moments of inertia. Thus, for example, the direction of the low-frequency transverse mode rotates together with the rotation when the torsion mode 502 is excited. Thereby, a parametric oscillator is formed, since the natural frequencies vary as a function of the rotation angle or thus as a function of time. The transfer of energy between the different states of the parametric oscillator brings about nonlinearities. In that a rotational symmetry of high order is used, the formation of the parametric oscillator can be prevented. Preferably, the support elements are arranged in such a manner that there is no dependency of the natural frequencies on the torsion angle.

By avoiding nonlinearities in the excitation of the torsion mode of the support elements 101-1, 102-1, 101-2, 102-2, it can be achieved that particularly large scanning angles of the light can be achieved by the torsion mode 502.

The twisting of the support elements 101-1, 102-1, 101-2, 102-2 into one another along the central axis 220 and the twisting of the support elements 101-1, 102-1, 101-2, 102-2 along their longitudinal axes increase as the distances to the base 141 increase and they also increase as the torsion angles increase. For example, if the torsion angle of the torsion mode 502 is greater than the angular distance between the support elements 101-1, 102-1, 101-2, 102-2 (in the example of FIG. 18, 90°, due to the four-fold rotational symmetry), there is a complete twisting with longitudinal overlap of the support elements 101-1, 102-1, 101-2, 102-2 into one another. In general, the torsion angle of the torsion mode 502 can thus be greater than 360°/n, where n describes the order of the rotational symmetry. Thereby, the twisting of the support elements 101-1, 102-1, 101-2, 102-2 into one another is promoted. This parallel kinematics enables large scanning angles with at the same time minor non-linear effects, in particular a low space requirement.

Figure 19:
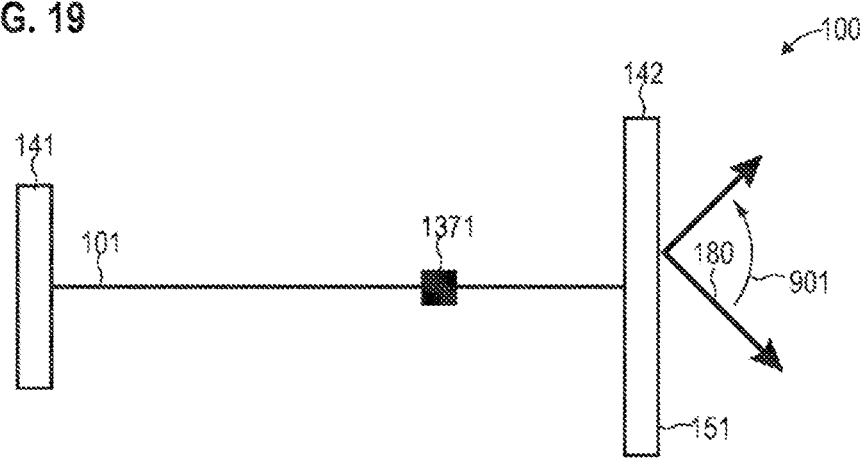
FIGS. 19 and 20 diagrammatically illustrate a transverse mode of a scanning module with a separate support element according to various examples.
Figure 20:
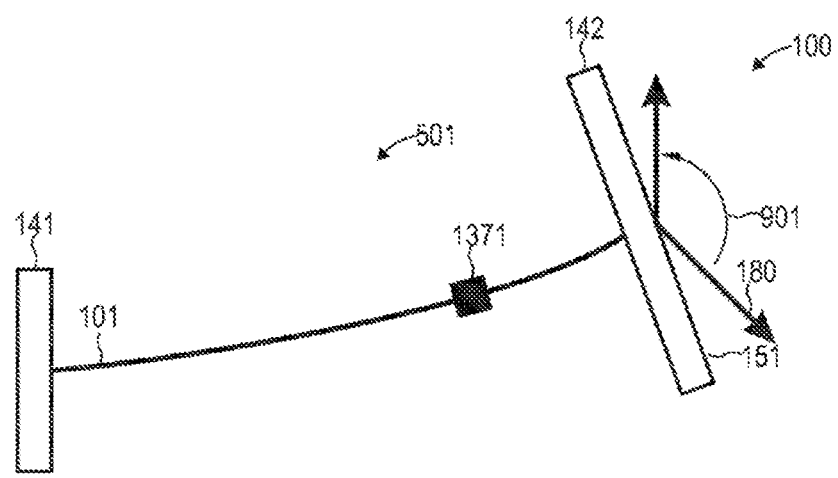

FIG. 19 illustrates aspects with regard to a scanning module 100. In the example of FIG. 19, the scanning module 101 comprises a single support element 101 with an optional balancing weight 1371. Therefore, when the transverse mode 501 is excited, a tilting of the mirror surface 151 occurs. This is represented in FIG. 20. In FIG. 20, in particular the transverse mode 501 of lowest order is represented. In other examples, it would also be possible to use a transverse mode of higher order for the scanning of light 180, wherein the deflection of the support element 101 at certain positions along the length 211 of the support element 101 would then be equal to zero (so-called node or bulge of the deflection).

Figure 21:
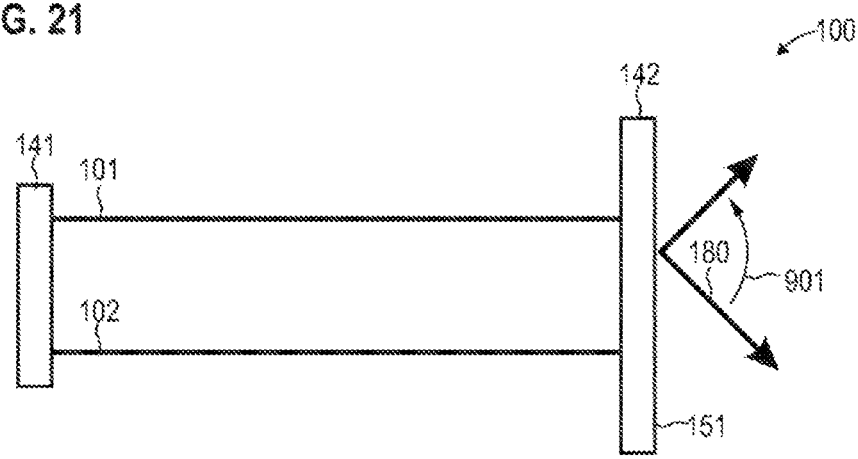
FIGS. 21 and 22 diagrammatically illustrate a transverse mode of a scanning module with two parallel support elements according to various examples.
Figure 22:
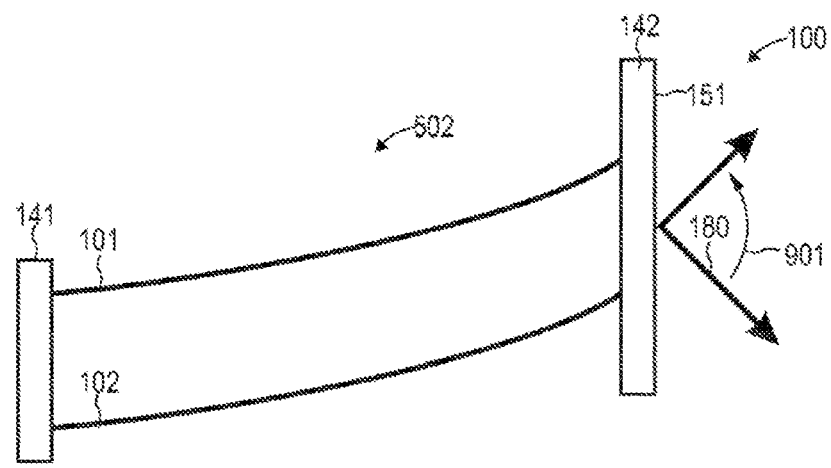

FIG. 21 illustrates aspects with regard to a scanning module 100. In the example of FIG. 21, the scanning module 101 comprises a pair of support elements 101, 102. The support elements are arranged in a plane (the plane of the drawing in FIG. 21). When the transverse mode 502 is excited with deflection in this plane, no tilting of the mirror surface 151 occurs. Therefore, the deflection of the light 180 is not influenced by the excitation of the transverse mode 502. This is represented in FIG. 22. Thereby, a system-inherent stabilization with respect to vibrations can be achieved. A particularly strong stabilization can be achieved, for example, when more than two support elements which do not all lie in the same plane are used. This would be the case, for example, of the scanning module 100 according to the example of FIG. 17.

Figure 23:
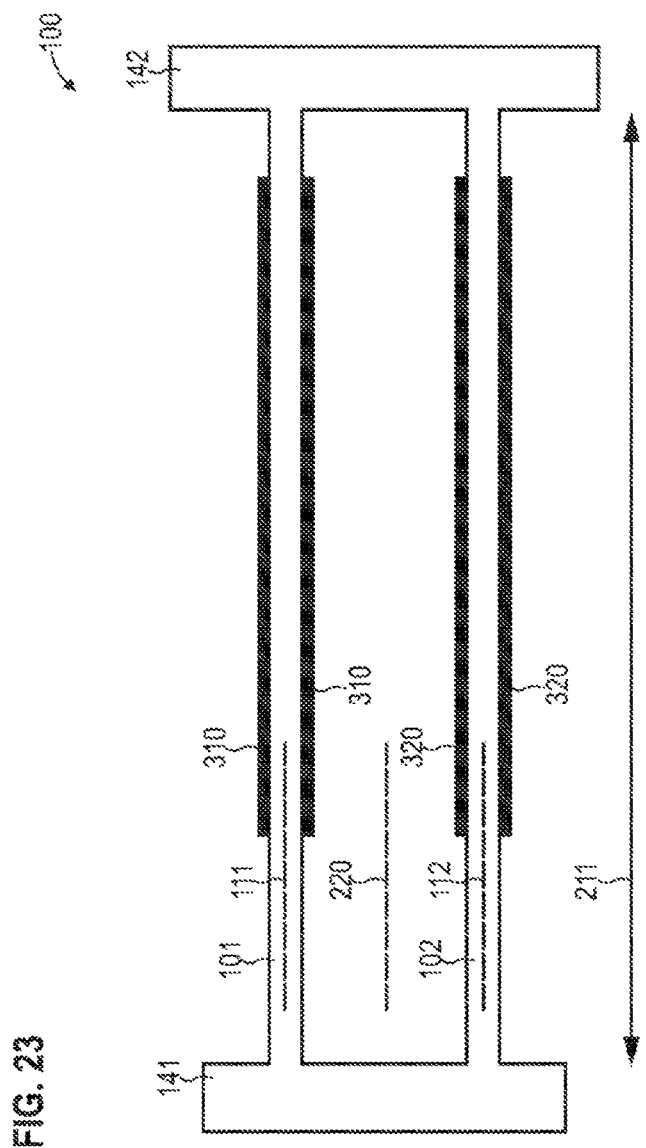
FIG. 23 diagrammatically illustrates a scanning module for a light scanner according to various examples, wherein the scanning module in FIG. 23 has two support elements arranged parallel to one another with respective piezo material.

FIG. 23 illustrates aspects with regard to a scanning module 100. In the example of FIG. 23, the piezo actuators 310, 320 are applied directly onto the support elements 101, 102, for example, by vapor deposition processes. Thereby, it can be achieved that the excitement of the degrees of freedom of motion 501, 502 does not occur via the base 141; instead, it occurs directly in the region of the support elements 101, 102. This can enable a particularly efficient and space-saving excitation.

Alternatively or additionally to the excitation, the corresponding piezoelectric layer can also be used to detect the curvature of the support elements. Thereby, the deflection angle 901, 902 can be determined particularly precisely. For example, multiple piezoelectric layers can be attached on different sides of the support elements 101, 102 in order to detect different directions of the curvature.

Figure 24:
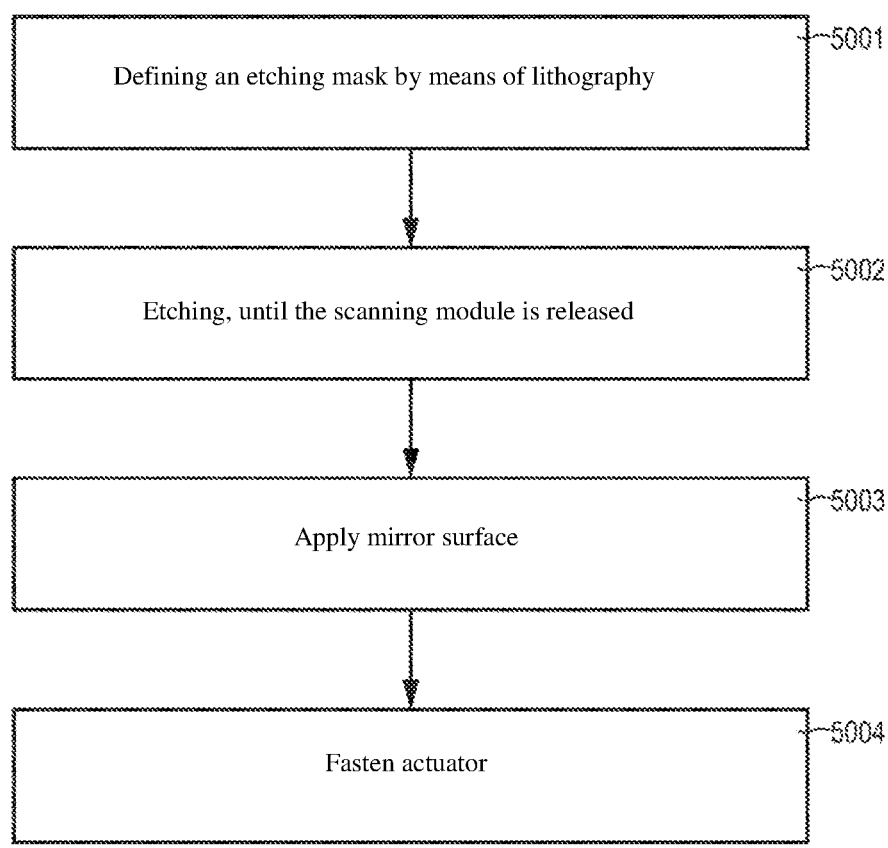
FIG. 24 is a flow chart of an example of a method for producing a scanning module.

FIG. 24 is a flow chart of an example of a method for producing a scanning module. For example, by means of the method according to FIG. 24, the scanning module 100 according to different examples described herein could be produced.

First, in step S001, on a wafer—for example, an Si wafer or an SOI wafer—an etching mask is defined by means of lithography. The wafer can have a thickness of 500 µm, for example.

Then, in step S002, the wafer is etched. Here, the etching can be carried out, for example, from the front side and/or from the back side of the wafer. In this manner, the scanning module or portions of the scanning module (etched structure) is/are obtained in the form of a single-piece and free standing structure.

In step S002, the etching can occur from one or more sides of the wafer. For example, first, the front-side etching could occur, for example, with an SOI etching stop. Then, a back-side etching could occur, for example, in order to define a recess in the edge region of the base. Thereby, the edge region can obtain a high form-induced resilience.

Optionally, subsequently multiple etched structures could be connected to one another by gluing or anodic bonding (compare FIG. 17 and FIG. 25). Thereby, the scanning module—to the extent that only parts are produced in step S002—can be completed. For example, before the connection of etched structures for obtaining the scanning module, a release of the etched structures to be connected could occur for this purpose, the wafer could be cut or sawed.

In step S003, the mirror surface is fastened to the scanning module 100. The mirror surface could then enclose an angle with the unetched wafer surface, for example, in the range of −60° to +60°, of optionally 45° or 0°. For example, the mirror surface could enclose an angle with the unetched wafer surface of 45°±15°.

In a simple case, the fastening of the mirror surface could comprise the deposition of aluminum or gold on a corresponding surface of the scanning module 100 or of the interface element 142. In other examples, for example, by means of an adhesive, a mirror 150 could be glued on the interface element 142. The mirror 150 could also be produced from a semiconductor material or else from glass. Anodic bonding would also be possible in order to fasten the mirror 150. Other examples of connection techniques comprise fusion bonding, fusion or direct bonding, eutectic bonding, thermocompression bonding, and adhesive bonding. Thus, in general, the mirror 150 can be secured on the scanning module 100.

In step S004, in principle an optional step, the actuator can be fastened on the scanning module 100. In a simple example, this could comprise the deposition of piezoelectric material on the support elements 101, 102 (compare FIG. 23). In other examples, it would also be possible that, for example, piezo bending actuators are fastened on the base 141.

Figure 25:
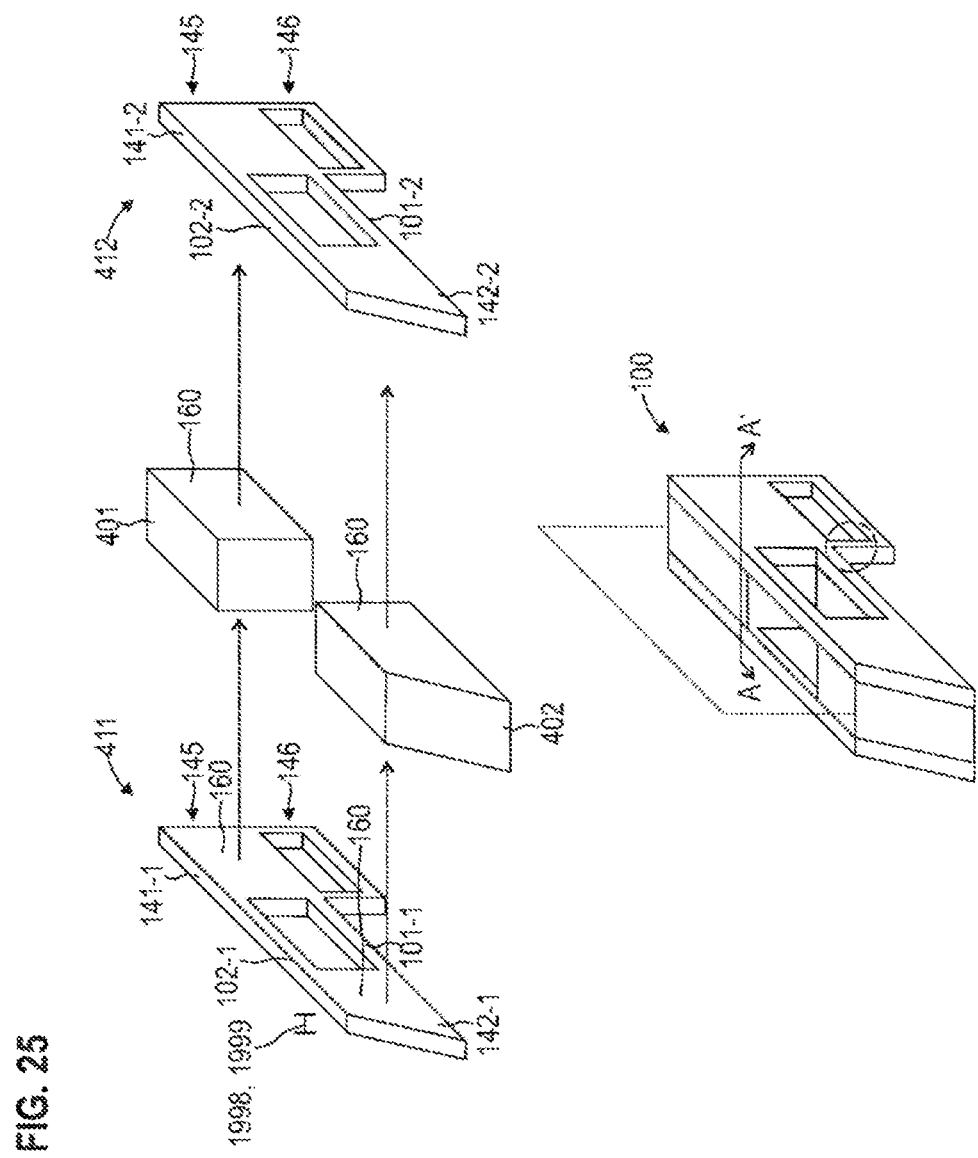
FIG. 25 diagrammatically illustrates the production of a scanning module according to various examples.

FIG. 25 illustrates aspects with regard to the production of a scanning module 100. In particular, FIG. 25 illustrates aspects with regard to the connection of multiple etched structures 411, 412.

In FIG. 25, it is represented that two identically etched structures 411, 412 are obtained by wafer processing. Each of the etched structures forms in each case a corresponding base 141-1, 141-2, a corresponding interface element 142-1, 142-2, and support elements 101-1, 102-1 and 101-2, 102-2.

In the example of FIG. 25, the base 141-1, the interface element 142-1 and the support elements 101-1, 102-1 all have the same thickness 1998, 1999 (in contrast to the scenario of FIG. 3). In the example of FIG. 25, the base 141-2, the interface element 142-2 and the support elements 101-2, 102-2 all have the same thickness 1998, 1999 (in contrast to the scenario of FIG. 3).

The two etched structures 411, 412 are connected to one another, for example, by bonding, gluing, for example, with epoxy adhesive or PMMA, etc. This is illustrated in FIG. 25 by the dashed-line arrows.

In the scenario of FIG. 25, the etched structures are not connected directly to one another. Instead, spacers 401, 402 are used. Said spacers are not integrally formed with the etched structures 411, 412. In detail, the base 141-1 of the etched structure 411 is connected to the base 141-2 of the etched structure 412 by a base spacer 401 arranged in between. Furthermore, the interface element 142-1 of the etched structure 411 is connected via the interface spacer 402 to the interface element 142-2 of the etched structure 412. For each spacer 401, 402, there are thus two connection surfaces on which, for example, adhesive, etc., is applied—, which are each associated with one of the two structures 411, 412.

Also represented in FIG. 25 is the plane of symmetry which, by mirroring, brings the two structures 411, 412 together and thus in particular reproduces the support elements 101-1, 102-2 into the support elements 101-2, 102-2. By appropriate dimensioning of the thickness of the spacers 401, 402, in turn an arrangement with four-fold rotational symmetry can be achieved (compare FIG. 18).

The spacers 401, 402 can also be obtained by lithography processing of a wafer. The spacers 401, 402 can also be produced from silicon, for example. In the example of FIG. 25, the spacers 401, 402 are bulky parts with a low form-induced resilience. This brings about a strong coupling of the two structures 411, 412 forming the scanning module 100.

By using the spacers 401, 402, in particular the distance between the support elements 101-1, 102-1 and 101-2, 102-2 can be adjusted in a flexible manner. In addition, it can be made possible that the etched structures do not have to have any lateral thickness variation—i.e., the bases 141-1, 141-2, the interface elements 142-1, 142-2 and the support elements 101-1, 101-2, 102-1, 102-2 can all have the same thickness 1998, 1999. This enables a particularly simple and less error-prone processing of the wafer. In addition, the material is not stressed. For example, SOI wafers can be dispensed with, since multiple etching stops are not necessary. This can reduce the cost of the process.

The form-induced resilience of the edge region 146 is made possible by the geometric form of the edge region 146: in the example of FIG. 25, the edge region 146 of the bases 141-1, 141-2 is designed U-shaped. The central region 145 and the edge region 146 have the same thickness 1998. In order to promote a tilting of the bases 141-1, 141-2 for the excitation of the torsion mode 502, the edge regions 146 of the bases 141-1, 141-2 have an increased form-induced resilience. In the example of FIG. 25, this is also achieved by recesses which are arranged in the edge regions 146 at a site facing the central regions 145 (highlighted in FIG. 25 by the circle drawn with a dashed line). Corresponding details are described in connection with FIG. 25.

Figure 26:
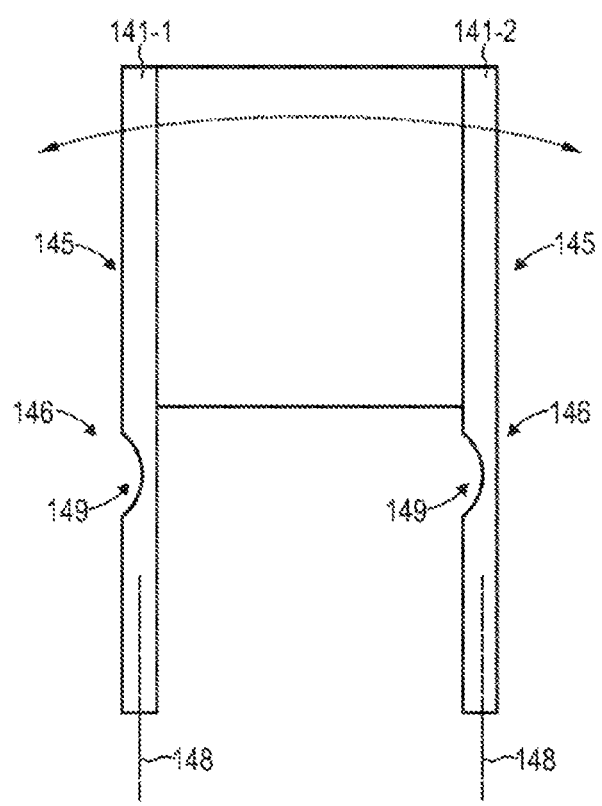
FIG. 26 is a cross-sectional view of the scanning module according to FIG. 25.

FIG. 26 illustrates aspects with regard to the scanning module 100. FIG. 26 is a cross-sectional view along line A-A' of FIG. 25. FIG. 26 in particular illustrates aspects with regard to a form-induced resilience of the edge regions 146 of the bases 141-1, 141-2.

In the example of FIG. 26, the bases 141-1, 142-2 comprise a central region 145 and an edge region 146 (compare also FIG. 4). Here, the edge regions 146 in each case have a recess 149 or groove/notch/tapering. The recess 149 is arranged in each case along an axis 148 which is arranged respectively perpendicularly to the longitudinal axes 111, 112 of the support elements (perpendicularly to the plane of the drawing of FIG. 26).

The recesses 149 are here arranged on a side of the bases 141-1, 141-2 facing the central region 145. The recesses 149 can be arranged adjoining the central region 145. Thereby, a tilting of the bases 141-1, 141-2 about the tilt axis can occur, the tilt axis being arranged parallel to the longitudinal axes 111, 112 of the support elements (perpendicular to the plane of the drawing of FIG. 26) (the tilting in FIG. 26 is represented by the dotted arrow). Such a tilting can occur by piezo bending actuators which are arranged at the edge regions 146—for example, at a distance from the recesses 149 (compare also FIGS. 5A, 5B, 6A, 6B).

The recesses could be generated by back-side structuring of a corresponding wafer, wherein the support elements can be generated by front-side structuring. Thereby, during mechanical ablation of wafer material, after the front-side structuring and before the back-side structuring, in the area of the recess, rupturing of the material or excessive stressing of the material can be prevented from occurring.

Naturally, the features of the above-described embodiments and aspects of the invention can be combined with one another. In particular, the features can be used not only in the described combinations, but also in other combinations or alone without leaving the scope of the invention.

For example, various techniques have been above with regard to the scanning module with a certain number of support elements. However, the various techniques can also be used for scanning modules having a different number of support elements.

While, for example, various techniques have been described above with regard to a laser scanner, it would in general also be possible to scan light other than laser light.

Various examples have been described with regard to a temporal and spatial superposition of a transverse mode and a torsion mode. In other examples, it would also be possible to superpose other degrees of freedom of motion temporally and spatially, for example, transverse modes of different orientation and/or transverse modes of different order. In general, it is also not necessary for a temporal and spatial superposition of different degrees of freedom of motion to occur. For example, in different scenarios, it would be possible that a degeneration between the different modes is eliminated and an individual mode is excited in a targeted manner.

For example, techniques of spatial and temporal superposition for fiber-based scanners in the German patent application DE 10 2016 010 448.1 have been discussed. The corresponding disclosure content—for example, relating to superposition figures and to the amplitude modulation of the excitation—is included here by reference. The corresponding techniques can also be used for single-piece MEMS scanners.

For example, techniques for the suppression of the tilting of the mirror surface have been described with regard to the German patent application DE 10 2016 013 227.2. The corresponding disclosure content—for example, relating to the rotationally symmetrical arrangement of multiple fibers—is included here by reference. The corresponding techniques can also be used for MEMS scanners.

Moreover, the above described examples have been described in connection with a piezoelectric drive. However, the techniques described herein can also be used with other drive forms, for example, a magnetic drive or an electrostatic drive.

The invention claimed is:

1. A scanning module for a light scanner, which comprises:
    a base,
    an interface element which is configured to secure a mirror surface, and
    at least one support element, which is configured to be resilient, and extends between the base and the interface element and has an extension perpendicular to the mirror surface which is no less than 0.7 mm,
    wherein the base, the interface element and the at least one support element are integrally formed,
    an additional base which is connected to the base and is not integrally formed therewith,
    an additional interface element, which is connected to the interface element, not integrally formed therewith and configured to secure the mirror surface, and
    at least one additional support element which is configured to be resilient, and extends between the additional base and the additional interface element.

2. The scanning module according to claim 1,
    wherein the at least one support element is configured to be rod-shaped along a longitudinal axis which has a component perpendicular to the mirror surface,
    wherein the length of the at least one support element is no less than 2 mm.

3. The scanning module according to claim 1,
    wherein a longitudinal axis of the at least one support element encloses an angle with a surface normal of the mirror surface, which is in the range of −60° to +60°.

4. The scanning module according to claim 1,
    wherein the at least one support element comprises at least two support elements, and
    wherein longitudinal axes of the at least two support elements pairwise in each case enclose angles with one another which are no greater than 45°,
    wherein the at least two support elements are arranged in a plane.

5. The scanning module according to claim 1,
    wherein the at least one support element is reproduced by reflection at a plane of symmetry on the at least one additional support element.

6. The scanning module according to claim 1,
    wherein the base is connected to the additional base via a base spacer, and/or
    wherein the at least one interface element is connected to the at least one additional interface element via an interface spacer.

7. The scanning module according to claim 1,
    wherein the base comprises a central region and an edge region,
    wherein the at least one support element extends away from the central region, and
    wherein the edge region has a form-induced resilience which is greater than the form-induced resilience of the central region.

8. The scanning module according to claim 7,
    wherein the edge region has a recess.

9. The scanning module according to claim 1, which moreover comprises:
    the mirror surface which is connected to the interface element and which is not integrally formed therewith,
    a mirror with the mirror surface and a back side opposite the mirror surface,
    wherein the interface element is attached to the back side of the mirror, and
    wherein the at least one support element extends away from a back side of the mirror, which is opposite the mirror surface.

10. The scanning module according to claim 1,
    wherein the at least one support element comprises at least two support elements, and
    wherein a distance between two adjacent support elements of the at least two support elements is in the range of 2%-50% of the length of at least one of the at least two support elements.

11. The scanning module according to claim 1,
    wherein the at least one support element comprises n support elements,
    wherein n is greater than or equal to two, and
    wherein the n support elements are arranged with n-fold rotational symmetry.

* * * * *